United States Patent [19]

Moriyama

[11] Patent Number: 4,696,007

[45] Date of Patent: Sep. 22, 1987

[54] METHOD OF CORRECTING ERRORS IN BINARY CODED WORDS

[75] Inventor: Yoshiaki Moriyama, Tokorozawa, Japan

[73] Assignee: Pioneer Electronic Corporation, Tokyo, Japan

[21] Appl. No.: 756,687

[22] Filed: Jul. 19, 1985

[30] Foreign Application Priority Data

Jul. 20, 1984 [JP] Japan ................. 59-150765

[51] Int. Cl.$^4$ ............................................. G06F 11/10
[52] U.S. Cl. .......................................... 371/37; 371/50
[58] Field of Search .................... 371/37, 39, 40, 50

[56] References Cited

U.S. PATENT DOCUMENTS

| | | | |
|---|---|---|---|
| 3,200,374 | 8/1965 | Ballard | 371/50 |
| 4,447,902 | 5/1984 | Wilkinson | 371/39 |
| 4,477,903 | 10/1984 | Schouhamer Immink | 371/37 |
| 4,495,623 | 6/1985 | George | 371/40 X |
| 4,541,092 | 9/1985 | Sako | 371/37 X |
| 4,546,474 | 10/1985 | Sako | 371/37 X |
| 4,564,945 | 1/1986 | Glover | 371/50 |
| 4,627,058 | 12/1986 | Moriyama | 371/37 |

Primary Examiner—Jerry Smith
Assistant Examiner—Robert W. Beausoliel
Attorney, Agent, or Firm—Schwartz, Jeffery, Schwaab, Mack, Blumenthal & Evans

[57] ABSTRACT

A method of correcting errors in binary coded words with use of a word block consisting of a plurality of data words and a plurality of error check words and consisting of a plurality of subblocks which can be selectively grouped on the basis of one of three different criteria to form one of three different sets of subblocks, wherein one set of subblocks include error check words to provide one error detection code and the other two sets of subblocks include error check words codes to provide two error correction codes. The detection and correction of errors in the data and error check words in the word block being effected by repetition of a cycle including detection of errors on the basis of the error detection code, correction of errors on the basis of one of the two error correction codes and correction of errors on the basis of the other of the two error correction codes.

9 Claims, 43 Drawing Figures

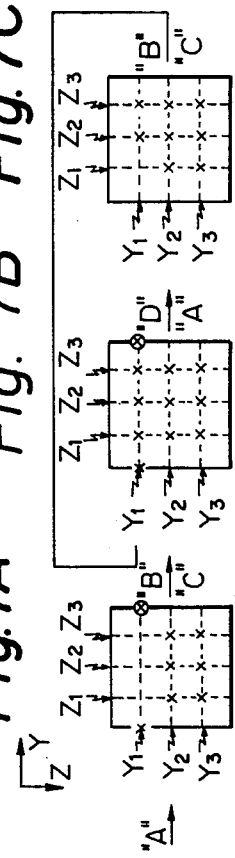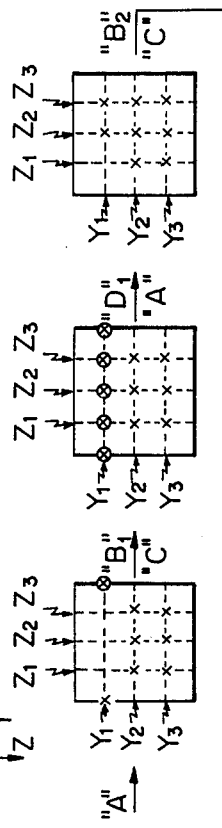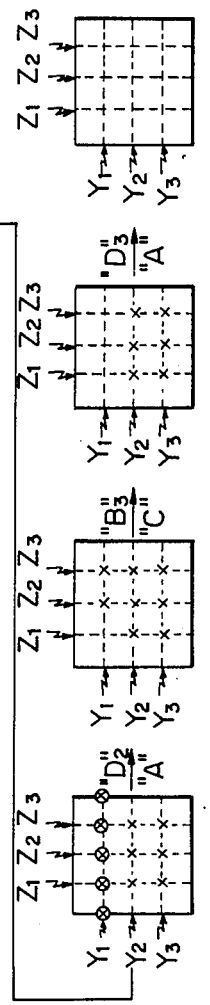

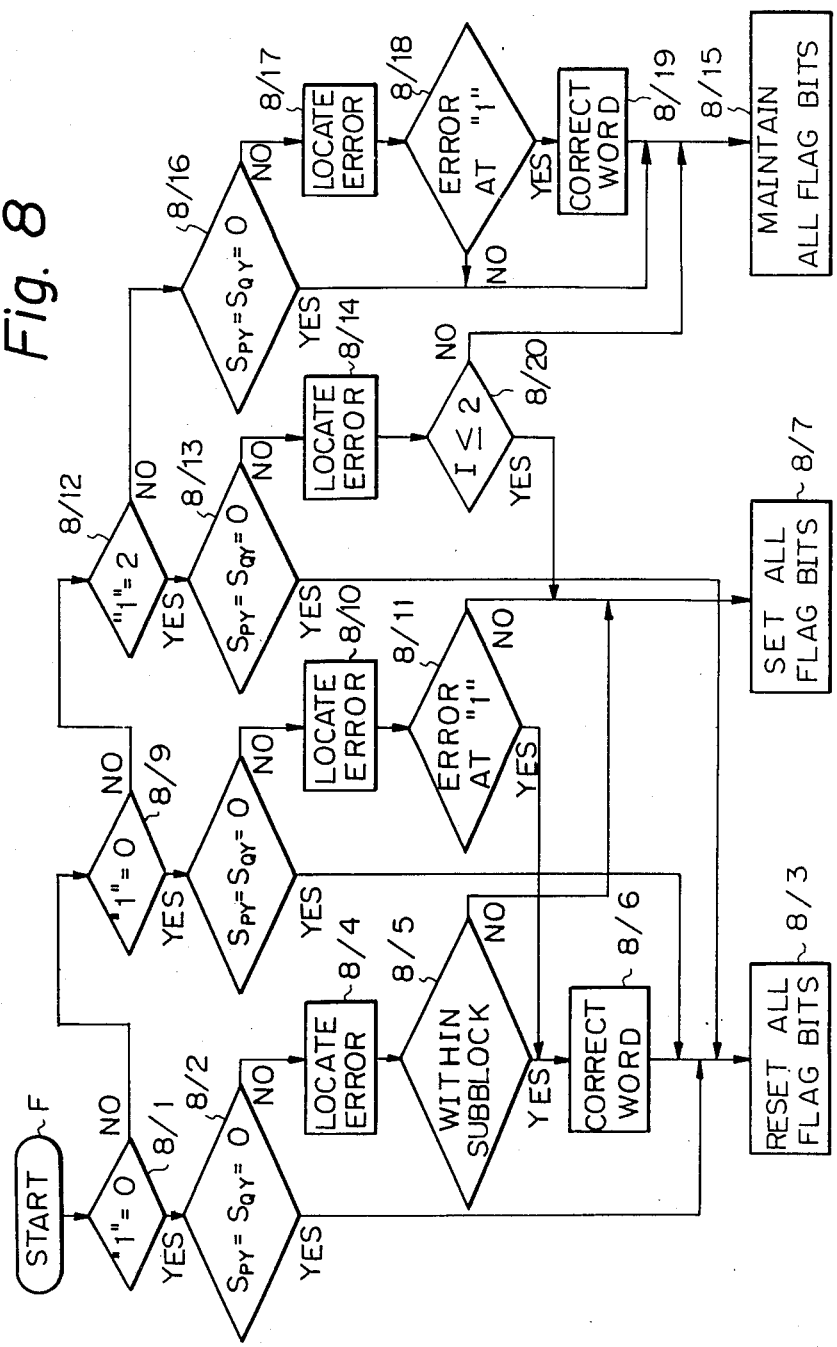

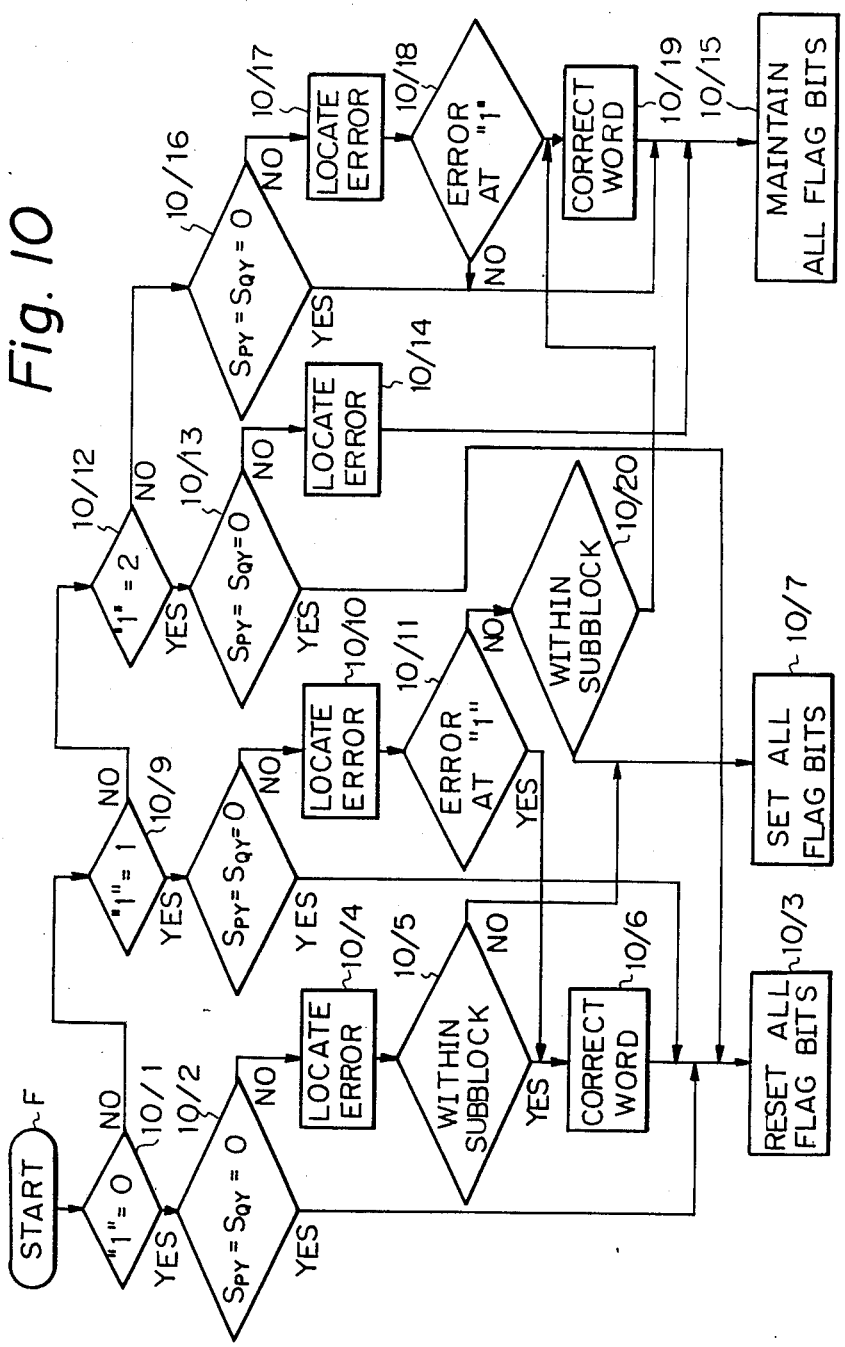

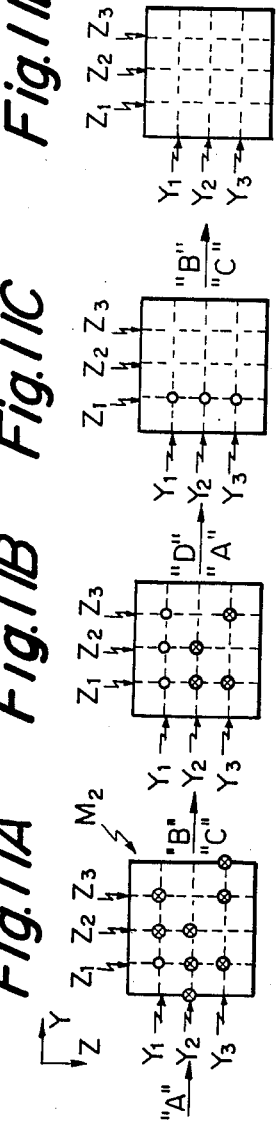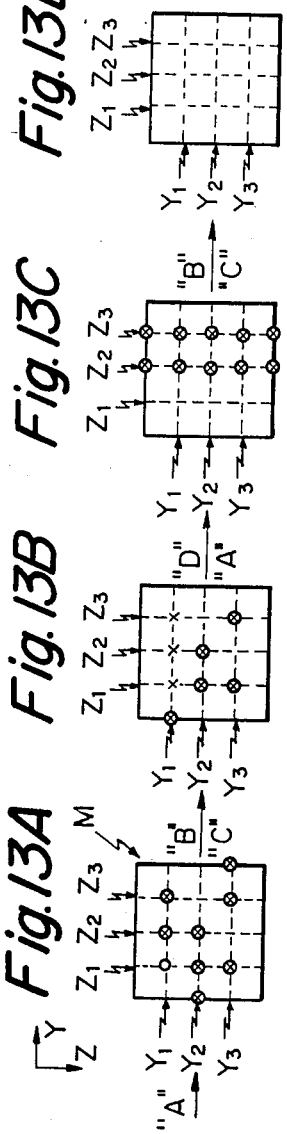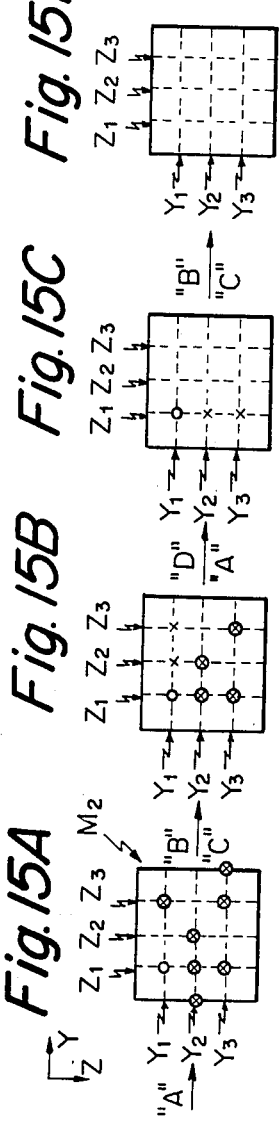

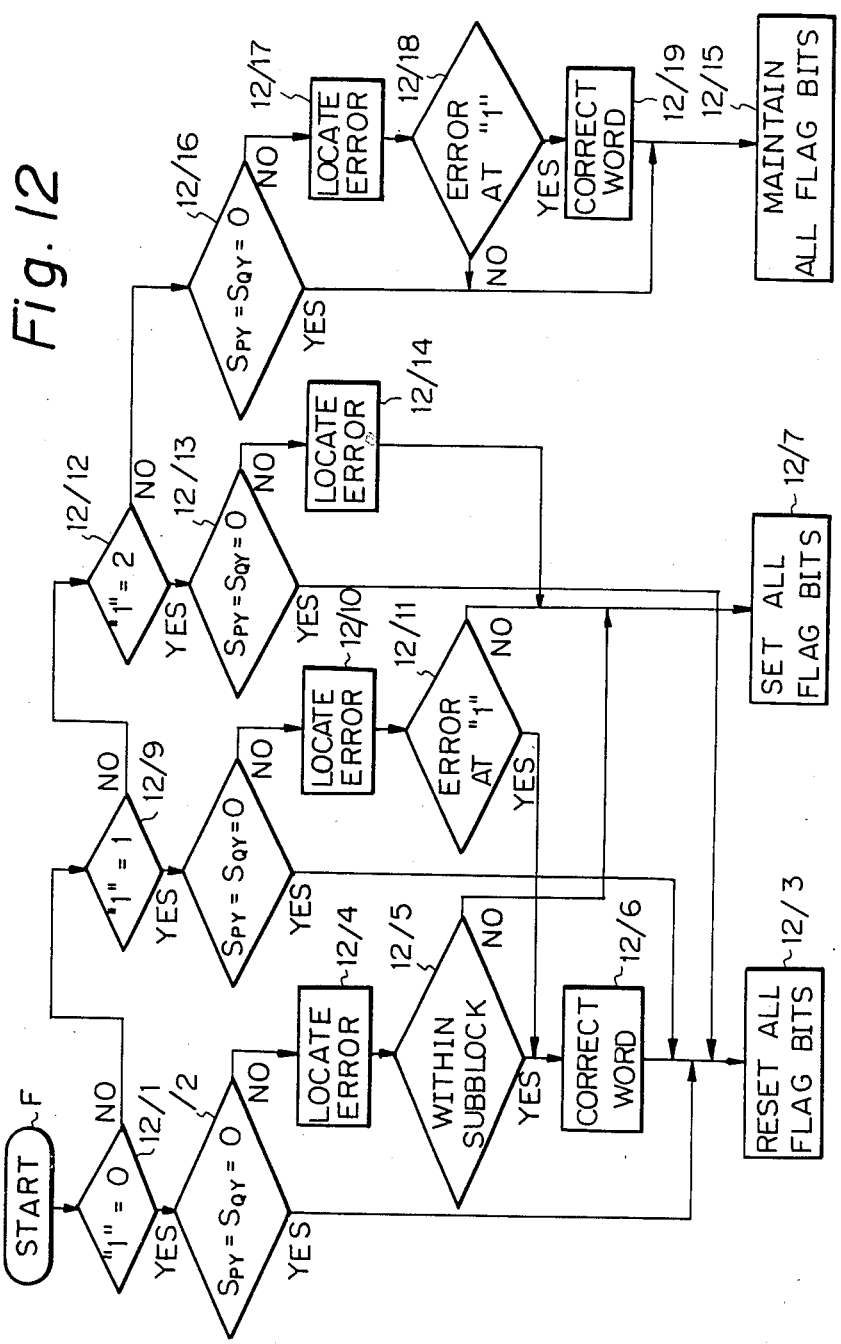

METHOD OF CORRECTING ERRORS IN BINARY CODED WORDS

FIELD OF THE INVENTION

The present invention relates to error-free recovery of binary coded data and, particularly, to a method of correcting errors contained in binary coded data. More particularly, the present invention relates to correction of errors in binary coded data with use of a code or word block which consists of a myriad of data words and plural sets of error check words. These plural sets of error check words are arranged in different directions and respectively provide a set of error detection codes and two sets of error correction codes for use in the correction of the data words.

SUMMARY OF THE INVENTION

In accordance with an important aspect of the present invention, there is provided a method of correcting errors in binary coded words organized in a word block consisting of a plurality of data words and a plurality of error check words and consisting of a plurality of subblocks which can be selectively grouped on the basis of one of three different criteria to form one of three different sets of subblocks which consist of first, second and third sets of subblocks wherein, if any at least two of the data words and error check words in the word block are included in one of the first, second and third subblocks, the particular two could not be concurrently included within each of the other subblocks, comprising generating a first error correction code on the basis of each of the subblocks in the first set of subblocks, a second error correction code on the basis of each of the subblocks in the second set of subblocks, and an error detection code on the basis of each of the subblocks in the third set of subblocks, adding a binary coded flag to each of the plurality of data words and the plurality of error check words, the flag being indicative of the presence or absence of an error within the word to which the flag is added, detecting errors within each of the third set of subblocks on the basis of the error detection codes, correcting errors within each of the first set of subblocks on the basis of the first error correction code and thereafter errors within each of the second set of subblocks and the second error correction code with reference the flags respectively added to the words in each of the subblocks, altering the flag of any of the data and error check words in each of the first set of subblocks each time the correction of errors within each of the first set of subblocks and altering the flag of any of the data and error check words in each of the second set of subblocks each time the correction of errors within each of the second set of subblocks is complete thereafter so that, each time the flag is altered, the flag is indicative of the absence of an error if the particular word is unlikely to contain an error and indicative of the presence of an error if the particular word is likely to contain an error or is likely to fail to be detected to be in error, further detecting errors within each of the third set of subblocks on the basis of the error detection codes for altering the flag of any of the data and error check words depending upon the result of the detection if the flag has remained unaltered, and altering or maintaining the flag of any of the data and error check words in the absence of an error detected in the particular word so that the flag altered or maintained coincides with the flag added to the particular word before the word was corrected, characterized in that correction of errors is effected a plurality of times for the data and error check words in a subblock on the basis of at least one of the first error correction code and the second error correction code and in that the manner of altering the flag of any of the data and error check words in each of the first set of subblocks and/or in each of the second set of subblocks and/or the manner of detecting errors within each of the third set of subblocks is varied depending upon the number of times the correction of errors is repeated.

BRIEF DESCRIPTION OF THE DRAWINGS

Figure 4:
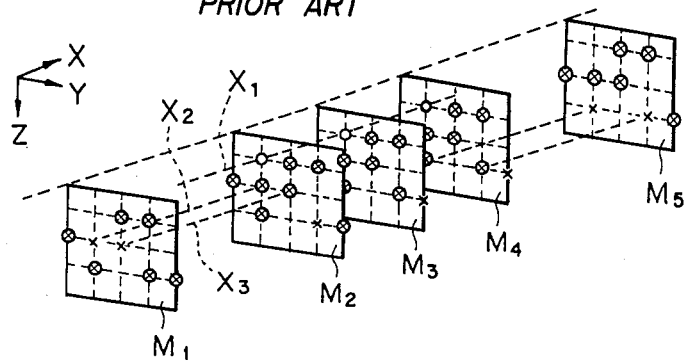
FIG. 4 is a diagram schematically showing examples of the error and flag patterns on several parallel planes having perpendicular dimensions respectively corresponding to the "Y" and "Z" directions of the word block illustrated in FIG. 1.

The features and advantages of a method according to the present invention will be more clearly understood from the following description taken in conjunction with the accompanying drawings in which:

FIGS. 7A to 7C are schematic diagrams which exemplify an error correction procedure to correct errors in an error and flag pattern different from the pattern represented by one of the Y-Z planes shown in FIG. 4;

FIG. 8 is a flowchart showing the steps to carry out a preferred example of a method of correcting errors in binary coded data in accordance with the present invention;

FIGS. 9A to 9G are schematic diagrams which exemplify an error detection and correction procedure to be performed on the basis of the flowchart of FIG. 8 correct errors in an error and flag pattern represented by one of the Y-Z planes shown in FIG. 4;

FIG. 10, is a flowchart showing the steps to carry out another preferred example of a method of correcting errors in accordance with the present invention;

Figs. 11A to 11D are schematic diagrams which exemplify an error detection and correction procedure to be performed on the basis of the flowchart of FIG. 10 correct errors in an error and flag pattern represented by one of the Y-Z planes shown in FIG. 4;

Figure 2:
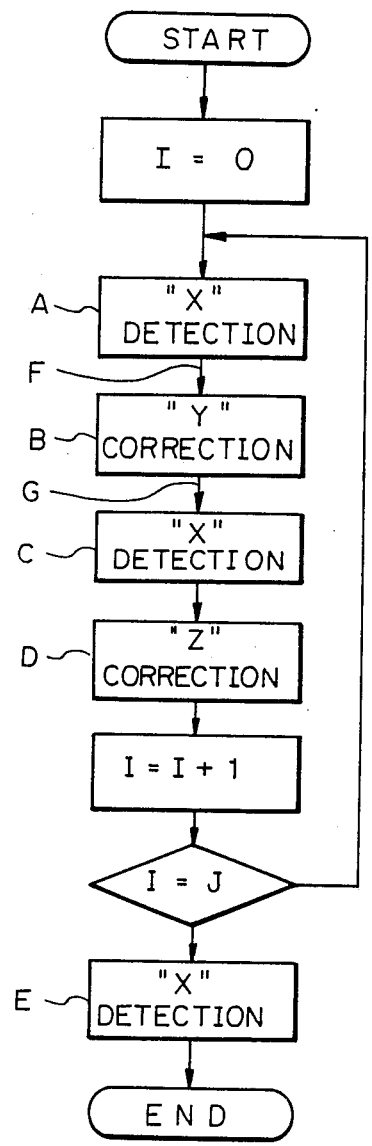
FIG. 2 is a flowchart showing the basic procedures to be followed in carrying out a known method of correcting errors using the word block illustrated in FIG. 1, the basic procedure being modified in carrying out preferred examples of a method of correcting errors in binary coded data in accordance with the present invention.
Figure 14:
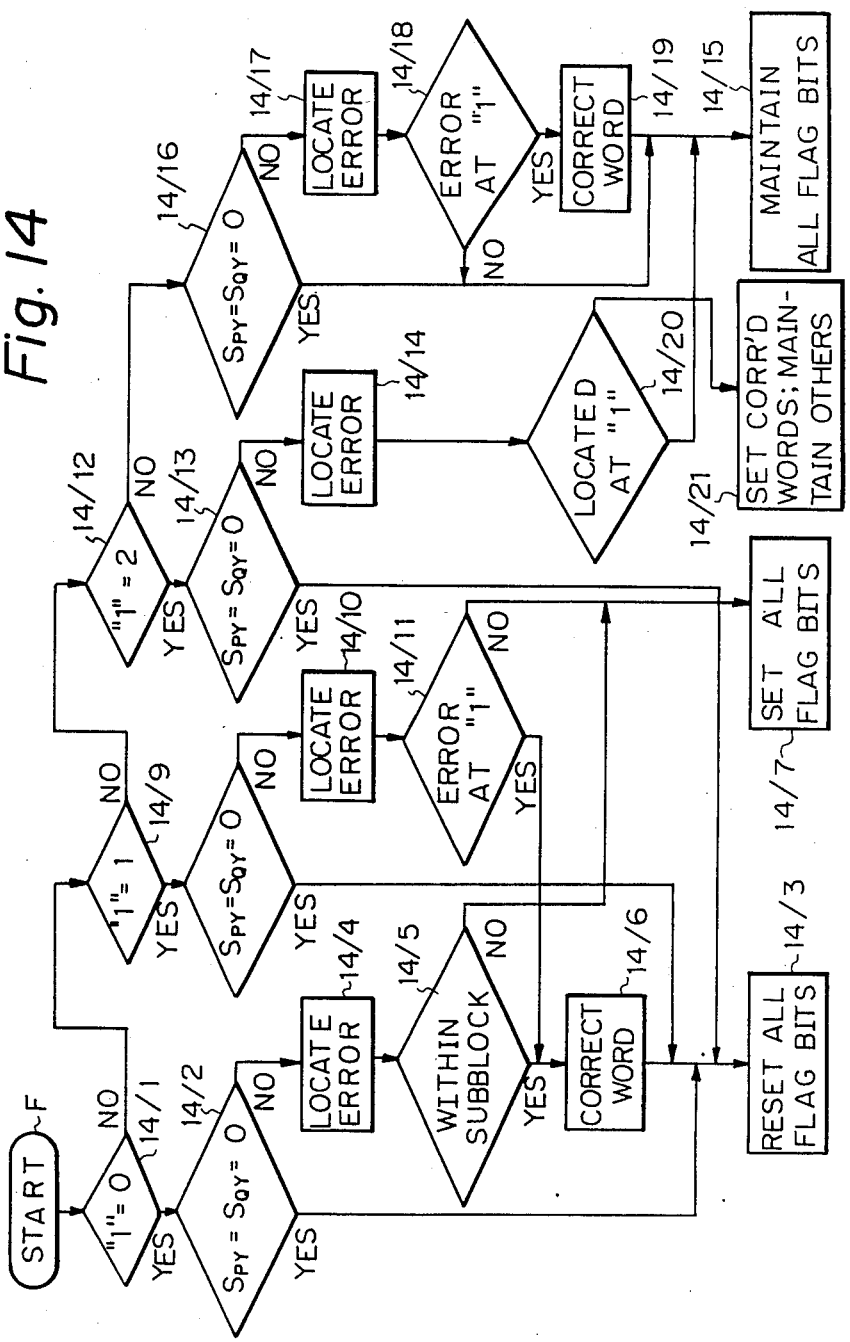
Figure 16:
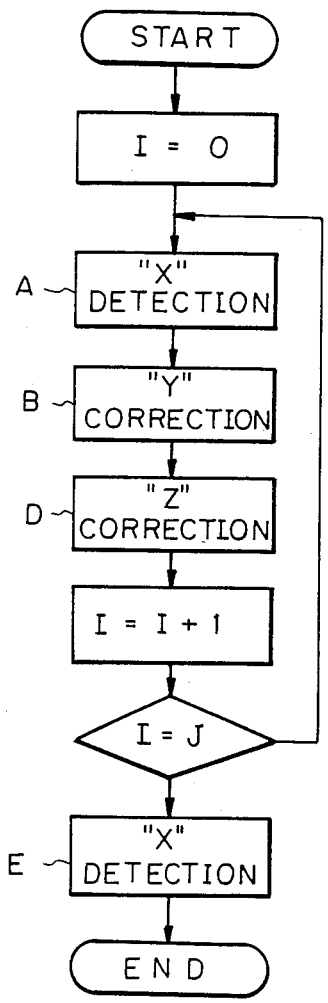
Figure 17:
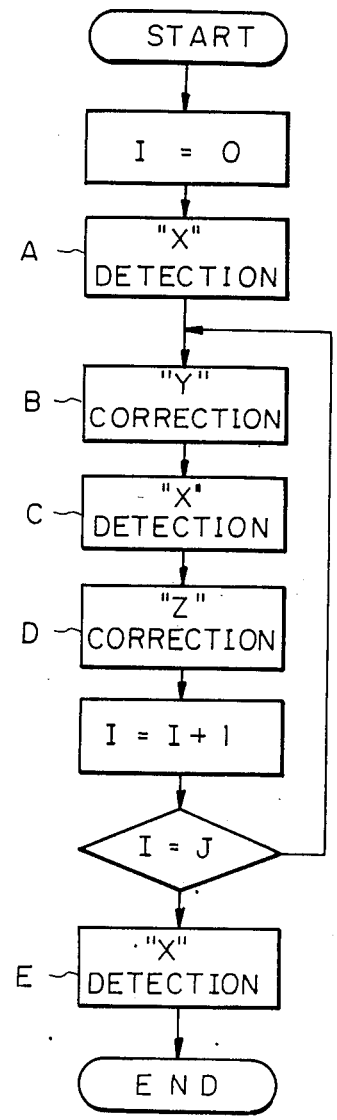
Figure 18:
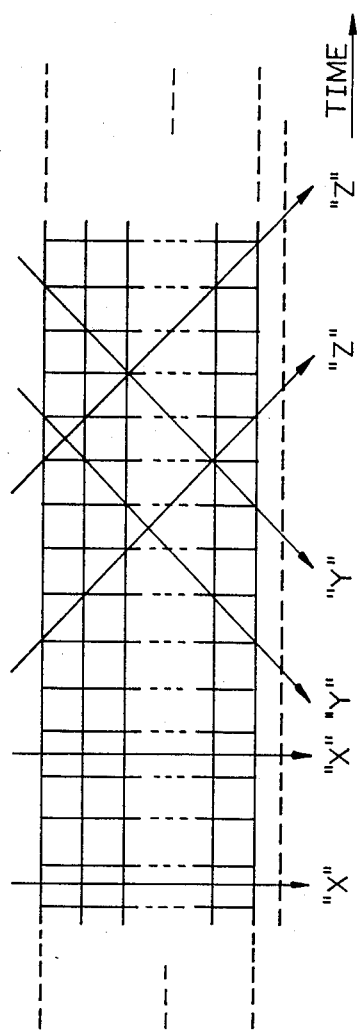
Figure 19:
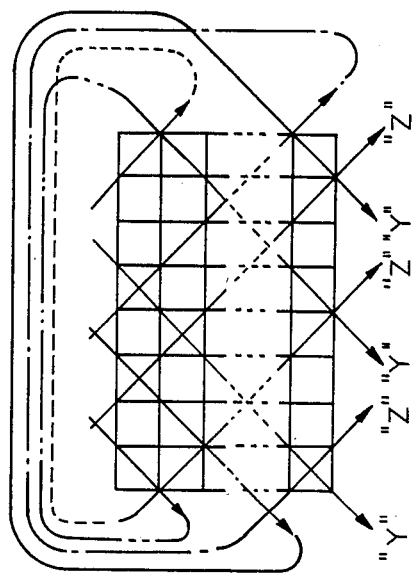
Figure 20:
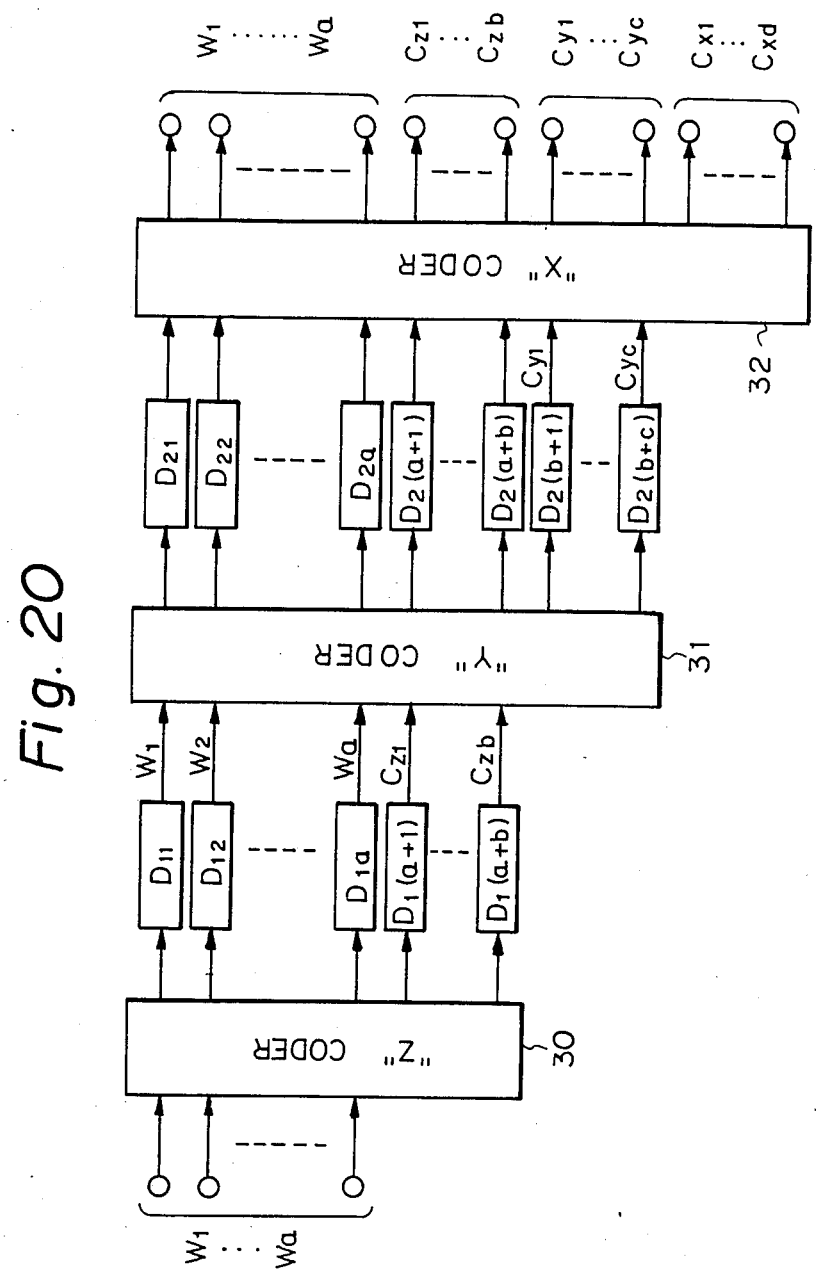

FIG. 12 is a flowchart showing the steps to carry out still another preferred example of a method of correcting errors in accordance with the present invention;

FIGS. 13A to 13D are schematic diagrams which exemplify an error detection and correction procedure to be performed on the basis of the flowchart of FIG. 12 correct errors in an error and flag pattern represented by one of the Y-Z planes shown in FIG. 4;

FIG. 14 is a flowchart showing the steps to carry out still another preferred example of a method of correcting errors in accordance with the present invention;

FIGS. 15A to 15D are schematic diagrams which exemplify an error detection and correction procedure to be performed on the basis of the flowchart of FIG. 14 correct errors in an error and flag pattern represented by one of the Y-Z planes shown in FIG. 4;

FIGS. 16 and 17 are flowcharts showing modifications of the basic procedures shown in FIG. 2;

FIGS. 18 and 19 are schematic diagrams showing other examples of a word block composed of data words and associated error check words arranged to be operable for carrying out a method of correcting errors according to the present invention; and FIG. 20 is a block diagram schematically showing the general arrangement of a preferred example of a coding network operable for producing the word block illustrated in FIG. 18.

DESCRIPTION OF THE PRIOR ART

Figure 1:
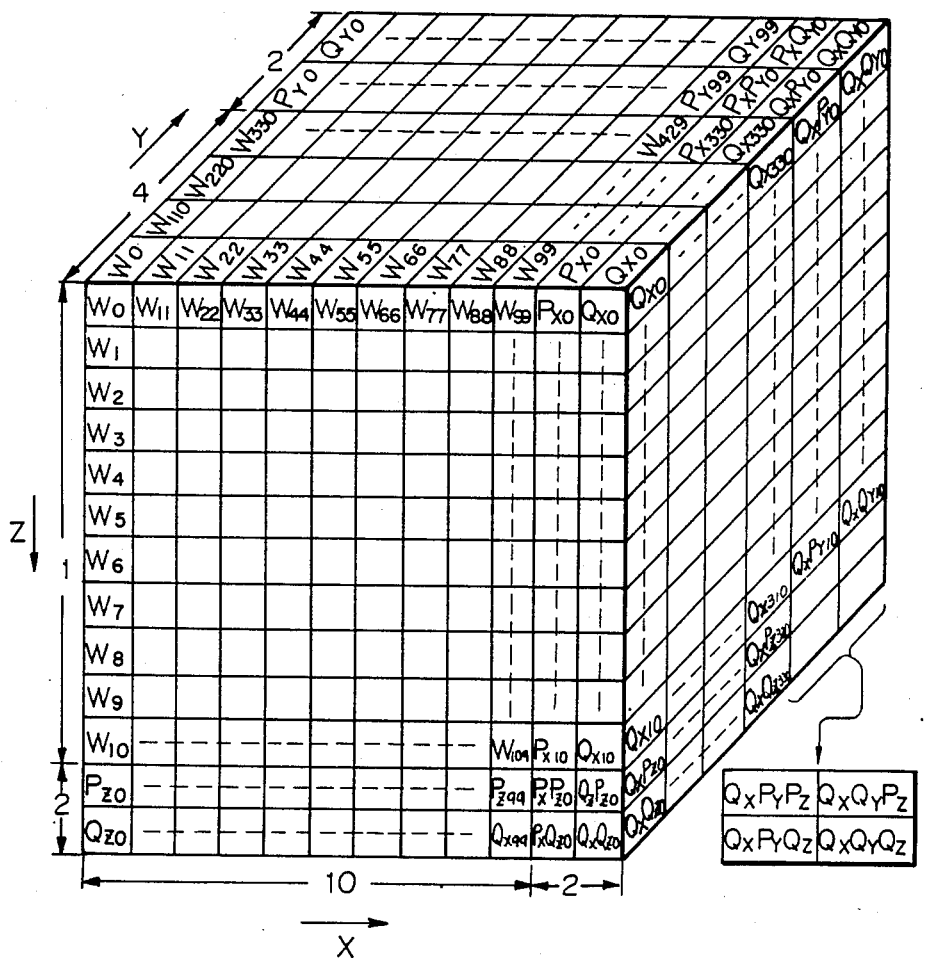
FIG. 1 is a perspective view showing a word block composed of data words and associated error check words arranged in the form of a three-dimensional matrix for use in a prior-art method of correcting errors.

In FIG. 1 of the drawings is shown a word block composed of binary coded data and error check words arranged in the form of a three-dimensional matrix. The word block herein shown exemplified has been proposed for use in a method of correcting errors as disclosed in the co-pending Japanese Patent Application No. 59-14040 and is useful to provide a single set of error detection codes and two sets of error correction codes. The method of correcting errors taught in this Application will be hereinafter referred to as prior-art method of correcting errors.

The word block shown in FIG. 1 consists of a total of 440 binary coded data words $W_0$ to $W_{439}$ and a total of 496 binary coded error check words of P/Q series. Each of the binary coded data and error check words thus forming the word block is composed of a suitable number of bits such as, for example, four or eight bits. These binary coded data and error check words are arranged in linear subblocks consisting of first-direction subblocks, second-direction subblocks, and third-direction subblocks. As will be understood as the description proceeds, the first-direction and second-direction subblocks include error check words to be used to provide two sets of error correction codes and the third-direction subblocks include error check words to be used to provide a set of error detection codes. These first-direction, second-direction, and third-direction subblocks are herein assumed to occur in directions of Z, Y and X as shown and will thus be hereinafter referred to as Z-direction subblocks, Y-direction subblocks and X-direction subblocks, respectively. Each of the Z-direction subblocks consists of 13 words consisting of 11 data words and 2 error check words. Each of the Y-direction subblocks consists of 6 words each consisting of 4 data words and 2 error check words. Each of the X-direction subblocks consists of a total of 12 words consisting of 10 data words and 2 error check words. The subscript annexed to the letter W for each of the data words $W_0$ to $W_{439}$ is indicative of the order in which the successive data words are to be sampled when in forming the three-dimensional matrix. Thus, the individual data and error check words forming the word block are sampled first in the "Z" direction, then in the "X" direction and lastly in the "Y" direction.

Each of the error check words is formulated in accordance with the Reed-Solomon coding system and the letters X, Y and Z in the subscripts to the P's and Q's for the individual error check words represent the directions X, Y and Z, respectively, in which the subblocks containing the particular error check words are arranged or extend. On the other hand, the numerals in the subscripts to the P's and Q's for the individual error check words represent the sequence in which the particular error check words appear in each of the X-direction, Y-direction and Z-direction subblocks. Thus, the error check word represented as $P_X P_{Y0}$, for example, is not only the word $P_X$ which is one of the error check words of an X-direction subblock but also the word $P_Y$ which is one of the error check words of a Y-direction subblock. The subscript 0 to the error check word $P_X P_{Y0}$ indicates that each of these particular two subblocks starts with an error check word having the subscript of numeral 0. Likewise, the error check word represented as $Q_X Q_Y Q_Z$, for example, is the word $Q_X$ which is one of the error check words of an X-direction subblock, the word $Q_Y$ which is one of the error check words of a Y-direction subblock, and the word $Q_Z$ which is one of the error check words of a Z-direction subblock. Similar principles apply to the other error check words indicated by combinations of P and Q with subscripts. The reason for which one error check word can be the check words in subblocks of different two or three directions is accounted for by the intrinsic linearity of the Reed-Solomon codes.

For the formation of the three-dimensional matrix word block thus configured, the eleven data words $W_0$, $W_1$, $W_2$, ... $W_{10}$ of the first or leftmost Z-direction subblock in the forefront plane of the word block as shown are first successively sampled in this sequence and are followed by the two error check words $P_{Z0}$ and $Q_{Z0}$ in this subblock. Then, the eleven data words $W_{11}$, $W_{12}$, $W_{13}$, ... $W_{21}$ of the second leftmost Z-direction subblock in the forefront plane are successively sampled in this sequence and are followed by the two error check words $P_{Z11}$ and $Q_{Z11}$ in this second subblock. Upon completion of the sampling of the 10 Z-direction subblocks including the data words, the eleven error check words $P_{X0}$, $P_{X1}$, $P_{X2}$, ... $PX_{10}$ followed by the additional two error check words $P_X P_{Z0}$ and $P_X Q_{Z0}$ of the eleventh Z-direction subblock and thereafter the eleven error check words $Q_{X0}$, $Q_{X1}$, $Q_{X2}$, ... $Q_{X10}$ followed by the additional two error check words $Q_X P_{Z0}$ and $Q_X Q_{Z0}$ of the twelfth Z-direction subblock in the forefront plane of the word block are successively sampled in these sequence. The data words $W_0$, $W_1$, $W_2$, ... $W_{109}$ and the error check words $P_{Z0}$, $P_{Z11}$, $P_{Z22}$, ... $P_{Z99}$; $Q_{Z0}$, $Q_{Z11}$, $Q_{Z22}$, ... $Q_{Z99}$; $P_X P_{Z0}$, $Q_X P_{Z0}$, $P_X Q_{Z0}$, $Q_X Q_{Z0}$ in all the Z-direction subblocks of the forefront plane of the word block are thus sampled in succession. Thereupon, the eleven data words $W_{110}$, $W_{111}$, $W_{112}$, ... $W_{219}$ followed by the two error check words $P_{Z0}$ and $Q_{Z0}$ in the first Z-direction subblock of the second forefront plane and then the eleven data words $W_{11}$, $W_{12}$, $W_{13}$, ... $W_{21}$ followed by the two error check words $P_{Z11}$ and $Q_{Z11}$ in the second leftmost Z-direction subblock of the second forefront plane of the word block are successively sampled in these sequences. Then, the eleven error check words $P_{X110}, P_{X111}, P_{X112}, \ldots P_{X120}$ followed by the additional two error check words $P_XP_{Z110}$ and $P_XQ_{Z110}$ of the eleventh Z-direction subblock and thereafter the eleven error check words $Q_{X110}, Q_{X111}, Q_{X112}, \ldots Q_{X120}$ followed by the additional two error check words $Q_XP_{Z110}$ and $Q_XQ_{Z110}$ of the twelfth Z-direction subblock in the second forefront plane of the word block are successively sampled in these sequences. The data words $W_{110}, W_{111}, W_{112}, \ldots W_{219}$ and the error check words $P_{Z110}, P_{Z121}, P_{Z132}, \ldots P_{Z209}$; $Q_{Z110}, Q_{Z121}, Q_{Z132}, \ldots Q_{Z209}$; $P_XP_{Z110}, Q_XP_{Z110}, P_XQ_{Z110}, Q_XQ_{Z110}$ in all the Z-direction subblocks of the second forefront plane of the word block are thus sampled in succession. Finally, the eleven error check words $Q_XQ_{Y0}, Q_XQ_{Y1}, Q_XQ_{Y2}, \ldots Q_XQ_{Y10}$ followed by the two additional error check words $Q_XQ_YP_Z$ AND $Q_XQ_YQ_Z$ of the twelfth Z-direction subblock in the rearmost plane of the word block are successively sampled in this sequence.

For purposes of description, it is herein assumed that each of the binary coded data and error check words thus arranged in the word block is composed of eight bits and that the Reed-Solomon coded error check words are given in the form of codes over Galois Field ($2^8$). During recording or transmission of the information represented by the data words, the individual data and error check words forming the word block are interleaved, viz., sampled successively in directions different from the directions in which the words have been sampled in forming the three-dimension matrix. For example, the data and error check words are sampled in succession first in the second or "X" direction, then in the third or "Y" direction and lastly in the first or "Z" direction. Thus, the data and error check words in all the X-direction subblocks of the uppermost horizontal plane of the word block are first sampled in succession in the "X" direction for each of the subblocks and in the "Y" direction for the individual subblocks in the particular plane. In this instance, the data and error check words in the uppermost horizontal plane of the word block are recorded or transmitted in the following sequence:

$$W_0, W_{11}, W_{22} \ldots W_{99}, P_{X0}, Q_{X0},$$

$$W_{110}, W_{121}, W_{132} \ldots W_{209}, P_{X110}, Q_{X110},$$

$$\ldots$$

$$W_{330}, W_{341}, W_{352} \ldots W_{429}, P_{X330}, Q_{X330},$$

$$P_{Y0}, P_{Y11}, P_{Y22} \ldots P_{Y99}, P_XP_{Y0}, Q_XP_{Y0},$$

$$Q_{Y0}, Q_{Y11}, Q_{Y22} \ldots Q_{Y99}, P_XQ_{Y0}, Q_XQ_{Y0}.$$

The data and error check words in the second uppermost horizontal plane of the word block are than recorded or transmitted in the following sequence:

$$W_1, W_{12}, W_{23} \ldots W_{110}, P_{X1}, Q_{X1},$$

$$W_{111}, W_{122}, W_{133} \ldots W_{210}, P_{X111}, Q_{X111},$$

$$\ldots$$

$$W_{331}, W_{342}, W_{353} \ldots W_{430}, P_{X331}, Q_{X331},$$

$$P_{Y1}, P_{Y12}, P_{Y23} \ldots P_{Y100}, P_XP_{Y1}, Q_XP_{Y1},$$

$$Q_{Y1}, Q_{Y12}, Q_{Y23} \ldots Q_{Y100}, P_XQ_{Y1}, Q_XQ_{Y1}.$$

The data and error check words in the third to eleventh horizontal planes of the work block are then recorded or transmitted, starting with the data words $W_3, W_4, W_5 \ldots W_{10}$ and ending with $Q_{X3}, Q_{X4}, Q_{X5}, \ldots Q_{X10}$ for the individual subblocks, respectively. The data and error check words in the twelfth horizontal plane of the word block are thereafter recorded or transmitted in the following sequence:

$$P_{Z0}, P_{Z11}, P_{Z22} \ldots P_{Z99}, P_XP_{Z0}, Q_XP_{Z0},$$

$$P_{Z110}, P_{Z121}, P_{Z132} \ldots P_{Z209}, P_XP_{Z110}, Q_XP_{Z110},$$

$$\ldots$$

$$P_{Z330}, P_{Z341}, P_{Z352} \ldots P_{Z429}, P_XP_{Z330}, Q_XP_{Z330},$$

$$P_XP_{Y0}, P_XP_{Y11}, P_XP_{Y22} \ldots P_XP_{Y99}, P_XP_YP_Z, Q_XP_YP_Z,$$

$$Q_XP_{Y0}, Q_XP_{Y11}, Q_XP_{Y22} \ldots Q_XP_{Y99}, P_XQ_YP_Z, Q_XQ_XP_Z.$$

For the last horizontal plane of the word block, the data and error check words are sampled in the following sequence:

$$Q_{Z0}, Q_{Z11}, Q_{Z22} \ldots Q_{Z99}, P_XQ_{Z0}, Q_XQ_{Z0},$$

$$Q_{Z110}, Q_{Z121}, Q_{Z132} \ldots Q_{Z209}, P_XQ_{Z110}, Q_XQ_{Z110},$$

$$\ldots$$

$$Q_{Z330}, Q_{Z341}, Q_{Z352} \ldots Q_{Z429}, P_XQ_{Z330}, Q_XQ_{Z330},$$

$$P_XP_{Y0}, P_XP_{Y11}, P_XP_{Y22} \ldots P_XP_{Y99}, P_XP_YQ_Z, Q_XP_YQ_Z,$$

$$Q_XP_{Y0}, Q_XP_{Y11}, Q_XP_{Y22} \ldots Q_XP_{Y99}, P_XQ_YQ_Z, Q_XQ_XQ_Z.$$

Where the data and error check words recorded or transmitted in the above sequence are reproduced or received, the information is de-interleaved, viz., sampled in the sequence in which they have been originally sampled in forming the word block shown in FIG. 1. The resultant, viz., de-interleaved series of data and error check words are processed for correction of errors, whereupon only the data words are extracted from the word block serially in the order of $W_0, W_1, W_2 \ldots W_{439}$. The inlerleaving and de-interleaving of the data and error check words in recording and reproduction or transmission and reception of the information is useful for dispersing the words in error especially when the errors include burst errors which can not be corrected, as well known in the art.

The error check words $P_U$ and $Q_U$ (where U is X, Y or Z) are generated in such manners as to satisfy the following relationships:

$$\sum_{k=1}^{V} W_k + P_U + Q_U = 0, \qquad \text{Eq. 1}$$

$$\sum_{k=1}^{V} \underline{a}^{V+2-k} W_k + \underline{a} P_U + Q_U = 0. \qquad \text{Eq. 2}$$

The indicated addition is to be accomplished by modulo-2 Galois Field defined operation and a is a primitive element of GF($2^8$). V is to assume the values of 10, 4 and 11 when U equals X, Y and Z, respectively, and the subscript k to W indicates the location of the data word within the subblock in which the particular data word occurs, the value of k starting with 0.

Now, Equations 1 and 2 result in:

$$P_U = \frac{\sum_{k=1}^{V} (1 + \underline{a}^{V+2-k}) W_k}{1 + \underline{a}},$$ Eq. 3

$$Q_U = \frac{\sum_{k=1}^{V} (\underline{a} + \underline{a}^{k+2-V}) W_k}{1 + \underline{a}}.$$ Eq. 4

On the reproduction or reception side, errors in up to two data and/or error check words can be corrected if the locations of the errors to be corrected are known for each of the subblocks in the individual directions of the word block shown in FIG. 1. If the locations of the errors to be corrected are unknown for each of the subblocks, then an error in only one data or error check word can be corrected. The correction of the error or errors is accomplished by taking the following procedure.

Syndromes $S_{PU}$ and $S_{QU}$ are first calculated for the data and/or error check words containing errors in accordance with the following relationships:

$$S_{PU} = \sum_{k=1}^{V} W_k + P_U + Q_U,$$ Eq. 5

$$S_{QU} = \sum_{k=1}^{V} \underline{a}^{V+2-k} W_k + \underline{a} P_U + Q_U,$$ Eq. 6 where the subscripts U, V and k are identical with those mentioned in respect of Equations 1 and 2.

Assuming now that the errors in two data words occur at locations where k=i and j, respectively, within the subblock in which the particular data words are contained and that the error patterns at these locations are represented by ei and ej, respectively, the above mentioned syndromes $S_{PU}$ and $S_{QU}$ are given as:

$$S_{PU} = ei + ej,$$ Eq. 7

$$S_{QU} = a^{V+2-i} ei + a^{V+2-j} ej.$$ Eq. 8

Thus, the error patterns ei and ej can be written $$ei = \frac{a^{V+2-j} S_{PU} + S_{QU}}{\underline{a}^{V+2-i} + \underline{a}^{V+2-j}},$$ Eq. 9

$$eJ = \frac{a^{V+2-i} S_{PU} + S_{QU}}{\underline{a}^{V+2-i} + \underline{a}^{V+2-j}}.$$ Eq. 10

From Equations 9 and 10 it will be seen that the error patterns ei and ej can be obtained from these relationships if the locations i and j of the errors within the subblock in which the data words in error occur are known.

If, on the other hand, the error in the single data word is assumed to occur at a location where k=i within the subblock in which the data word in error occurs and if the error pattern at this location is represented by ei, the syndromes $S_{PU}$ and $S_{QU}$ are given as:

$$S_{PU} = ei,$$ Eq. 11

$$S_{QU} = a^{V+2-i} ei.$$ Eq. 12

These Equations 11 and 12 result in the relationship $$a^i = a^{V+2} (S_{PU}/S_{QU})$$ Eq. 13

This Equation 13 shows that the error location i within the subblock can be calculated by obtaining the value of $a^i$ from the syndromes $S_{PU}$ and $S_{QU}$ if the error location i per se is unknown and that the error can be corrected since the error pattern ei per se equals the syndrome $S_{PU}$ as indicated by Equation 11.

In the meantime, the data and error check words in each of the X-direction subblocks appears regularly from one to another during recording or transmission of the information and, therefore, it frequently happens that errors occur in successive three or even more of these data and error check words. Thus, the data and error check words to be sampled in the "X" direction are more liable to err than the words to be samples in the "Y" and "Z" directions during recording or transmission of the words. It is for this reason mandatory to use Reed-Solomon codes for the detection of errors in the data and error check words to be sampled in the "X" direction. In this instance, words are determined to be free from errors if both of the syndromes $S_{PU}$ and $S_{QU}$ are zero ($S_{PU} = S_{QU} = 0$) and to contain errors if at least one of the syndromes $S_{PU}$ and $S_{QU}$ is not zero. Depending upon the result of such error detection, either a flag bit indicative of the presence of an error or a flag bit indicative of the absence of an error is added to each of the words thus tested.

The detection and correction of errors on the basis of such a principle is accomplished by following the procedures illustrated in the flowchart of FIG. 2 by the previously mentioned prior-art method of correcting errors. The procedures start with detection of errors for each of the X-direction subblocks of the whole word block (procedure A), whereby either a flag bit of, for example, "1" indicative of the presence of an error or a flag bit of, for example, "0" indicative of the absence of an error is added to every one of the data and error check words of all the X-direction subblocks. The error check words in the X-direction subblocks in the word block shown in FIG. 1 are used as error detection codes for this X-direction error-detection procedure A. The errors in the words including the bit "1" error flags are then corrected in the Y-direction subblocks of the whole word block (procedure B). The error check words in the Y-direction subblocks in the word block shown in FIG. 1 are used as error detection codes for this Y-direction error-correction procedure B. Detection of errors is thereafter accomplished for a second time for each of the X-direction subblocks (procedure C), whereupon the errors in the words including the bit "1" error flags are corrected in the Z-direction subblocks of the whole word block (procedure D). As the error detection codes for this second X-direction error-detection procedure C are also used the error check words in the X-direction subblocks in the word block and as the error detection codes for the Z-direction error-correction procedure D are used the error check words in the Z-direction subblocks in the word block shown in FIG. 1. The error detection and correction cycle including the first detection of errors in the X-direction subblocks, the correction of the errors in the Y-direction subblocks, the second detection of errors in the X-direction subblocks, the correction of the errors in the Z-direction subblocks is repeated by a desired number of times J. After such an error detection and correction cycle has been repeated the desired number of times J, detection of errors is further performed for each of the X-direction subblocks (procedure E) to put an end to the error correcting operation by the prior-art method of correcting errors.

Figure 3:
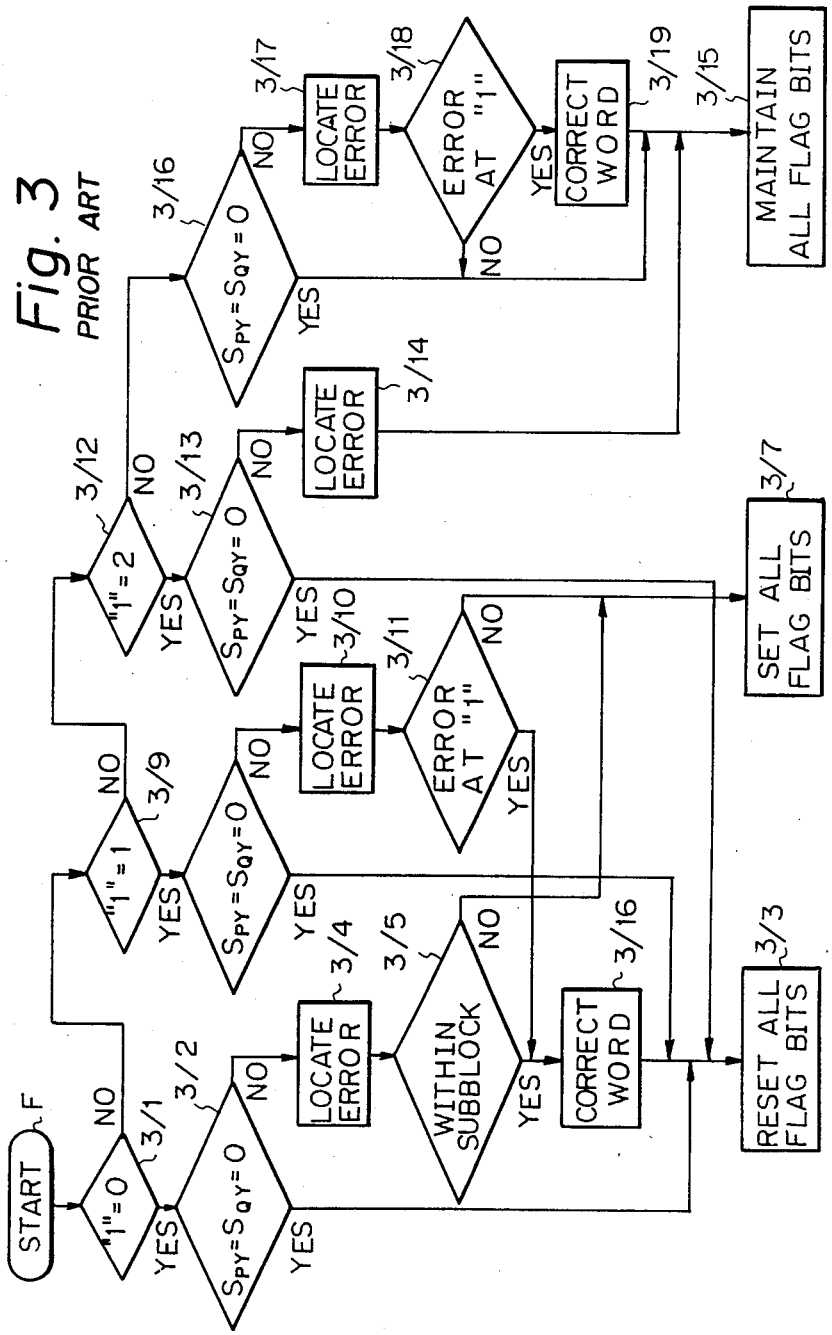
FIG. 3 is a flowchart showing the various individual steps to perform one of the procedures represented by the flowchart of FIG. 2 in carrying out the prior-art method of correcting errors.

The correction of the errors in the Y-direction subblocks of the word block as represented by Y-direction error-correction procedure B in FIG. 2 is effected by following the various process and decision steps indicated in the flowchart of FIG. 3 in the prior-art method of correcting errors. Thus, the steps shown in FIG. 4 intervene between the initial X-direction error-detection procedure A and the second X-direction error-detection procedure C of the flowchart of FIG. 2 as indicated at F and G, respectively in FIGS. 2 and 3.

Upon completion of the initial X-direction error-detection procedure A to detect errors in the X-direction subblocks of the word block, it is determined by a decision step 3/1 whether or not there are no bit "1" error flag words among the data and error check words in each of the Y-direction subblocks which have been checked by the procedure A in the flowchart of FIG. 2. If the answer in this decision step 3/1 is for any of the subblocks in the affirmative "YES" meaning that there are no bit "1" error flag words included in all the data and error check words in the Y-direction subblock, it is further determined by a decision step 3/2 whether or not both of the syndromes $S_{PY}$ and $S_{QY}$ for the Y-direction subblock are zero. For each of the Y-direction subblocks in which both of the syndromes $S_{PY}$ and $S_{QY}$ are found to be zero, it is deemed that there are no errors occurring in each subblock and, thus, the flag bits for all the data and error check words of the subblock are reset to "0"s as by a step 3/3. The flag bits thus reset by the step 3/3 are to be maintained during the subsequent second X-direction error-detection procedure C in the flowchart of FIG. 2 even if errors might be detected to occur in the X-direction subblock by the error-detection procedure C.

If it is found as a result of the decision step 3/2 that at least one of the syndromes $S_{PY}$ and $S_{QY}$ is not zero for any of the Y-direction subblocks, it is deemed that there must exist an error in the Y-direction subblock which has been determined to be free from errors during the initial X-direction error-detection procedure A in the flowchart of FIG. 2. In this instance, the location (i) of the error within the particular subblock is determined by a step 3/4 from the syndromes $S_{PY}$ and $S_{QY}$ in accordance with Equation 13. Thereupon, it is determined by a decision step 3/5 whether or not the location (i) at which an error has thus been detected to occur actually exists within the Y-direction subblock in question. When it is found by this decision step 3/5 that such a location actually exists in the subblock, it is deemed that the particular data word is the very word that has been regarded correct during the X-direction error-detection procedure A in the flowchart of FIG. 2 and, accordingly, the decision step 3/5 is followed by a process step 3/6 to correct the error in the data word in question. When the correction of the error is complete, it is decided that errors are no longer included in the Y-direction subblock in question and the flag bits for all the data and error check words of the subblock are reset to "0"s as by the step 3/3. If it is found by the decision step 3/5 that the particular word has the bit "1" error flag, it is deemed that the two or more words in error have been erroneously determined to be free from errors during the X-direction error-detection procedure A. The errors in these words could not be corrected insofar as the syndromes $S_{PY}$ and $S_{QY}$ alone are relied upon. In this instance, the flag bits for all the data and error check words of the subblock are set to "1"s as by a step 3/7. The flag bits thus set to "1"s are maintained during the subsequent second X-direction error-detection procedure C in the flowchart of FIG. 2 even in the absence of errors detected in the X-direction subblock by the error-detection procedure C.

If the answer in the initial decision step 3/1 is in the negative "NO" meaning that the linear Y-direction subblock in question contains one or more bit "1" flag words, it is determined by a decision step 3/8 whether or not there is one, and only one, bit "1" error flag word included in the data and error check words in the Y-direction subblock. If the answer in this step 3/8 is in the affirmative "YES", it is further determined by a decision step 3/9 whether or not both of the syndromes $S_{PY}$ and $S_{QY}$ for the Y-direction subblock including the single word having the bit "1" error flag are zero. If both of the syndromes $S_{PY}$ and $S_{QY}$ are found to be zero for the particular subblock, it is deemed that there are no errors occurring in the subblock and, thus, the flag bits for all the data and error check words of the subblock are reset to "0"s by the step 3/3. The flag bits thus reset by the step 3/3 are maintained during the subsequent X-direction error-detection procedure C even if errors might be detected to occur in the X-direction subblock in question as previously noted.

If it is found as a result of the decision step 3/9 that at least one of the syndromes $S_{PY}$ and $S_{QY}$ is not zero for the Y-direction subblock, the location (i) of the error within the particular subblock is determined by a step 3/10 from the syndromes $S_{PY}$ and $S_{QY}$ in accordance with Equation 13. Thereupon, it is determined by a decision step 3/11 whether or not the word at the location i where the error has thus been detected to occur has the bit "1" error flag within the subblock in question. When it is found by this decision step 3/11 that the particular word has the bit "1" error flag, it is deemed that the data word has been erroneously determined to be free from error during the initial X-direction error-detection procedure A. In this instance, the decision step 3/11 is followed by the process step 3/6 to correct the error in the data word in question. When the correction of the error is complete, it is decided that errors are no longer included in the Y-direction subblock in question and the flag bits for all the data and error check words of the subblock are reset to "0"s by the step 3/3. If it is found by the decision step 3/11 that the word at the location where the error has been detected to occur has the bit "0" error-free flag, it is deemed that there must exist another word which has been erroneously determined to be free from an error during the X-direction error-detection procedure A. In this instance, correction of the word with the bit "1" error flag on the basis of the syndromes $S_{PY}$ and $S_{QY}$ would be spurious or false and, for this reason, the flag bits for all the data and error check words of the subblock are set to "1"s by the step 3/7 without making such a false correction. Alternatively, the word with the bit "1" error flag might be corrected with use of the syndromes $S_{PY}$ and $S_{QY}$ if the flag bits for all the data and error check words of the subblock are to be set to "1"s thereafter. The flag bits thus set to "1"s are maintained during the subsequent second X-direction error-detection procedure C in the flowchart of FIG. 2 as previously noted.

If the answer in the decision step 3/8 is in the negative "NO" meaning that there are two or more bit "1"

error flag words included in the data and error check words in the Y-direction subblock in question, it is determined by a decision step 3/12 whether or not there are two, and only two, bit "1" error flag words within the subblock in question. If the answer in this step 3/12 is in the affirmative "YES", it is further determined by a decision step 3/13 whether or not both of the syndromes $S_{PY}$ and $S_{QY}$ for the Y-direction subblock including the two bit "1" error flag words are zero. If both of the syndromes $S_{PY}$ and $S_{QY}$ are found to be zero for the particular subblock, it is deemed that there actually are no errors occurring in the subblock and, thus, the flag bits for all the data and error check words of the subblock are reset to "0"s by the step 3/3.

If it is found by the decision step 3/13 that at least one of the syndromes $S_{PY}$ and $S_{QY}$ is not zero for the Y-direction subblock, it is deemed that the two data words each having the bit "1" error flag are actually in error. The decision step 3/12 is thus followed by a step 3/14 to correct these errors on the basis of the syndromes $S_{PY}$ and $S_{QY}$ in accordance with Equations 9 and 10 with the error locations i and j represented by the particular two words. In this instance, the flag bits for all the data and error check words of the subblock are neither reset to "0"s nor set to "1"s as indicated by an imaginary step 3/15 and are to be set or reset depending upon the results of the subsequent X-direction error-detection procedure C of the flowchart of FIG. 2.

If the answer in the decision step 3/12 is in the negative "NO" meaning that there are three or more bit "1" flag words included in the subblock in question, it is determined by a decision step 3/16 whether or not both of the syndromes $S_{PY}$ and $S_{QY}$ for the Y-direction subblock including the three bit "1" flag words are zero. If both of the syndromes $S_{PY}$ and $S_{QY}$ are found to be zero for the particular subblock, the flag bits for all the data and error check words of the subblock are neither reset to "0"s nor set to "1"s as indicated by the imaginary step 3/15 and are to be set or reset depending upon the results of the subsequent X-direction error-detection procedure C as above noted. If, on the other hand, it is found as a result of the decision step 3/16 that at least one of the syndromes $S_{PY}$ and $S_{QY}$ is not zero for the Y-direction subblock, the locations of the errors within the particular subblock are determined by a step 3/17 from the syndromes $S_{PY}$ and $S_{QY}$. Thereupon, it is determined by a decision step 3/18 whether or not the words at the locations where the errors have thus been detected to occur have the bit "1" error flags within the subblock in question. When it is found by this decision step 3/18 that any of these particular words has the bit "1" error flag, it is deemed that the particular word is in error and that the remaining words have been erroneously determined to be free from error by the error-detection procedure A. In this instance, the decision step 3/18 is followed by a process step 3/19 to correct the error in the actually erred data word and the flag bits for all the data and error check words of the subblock are maintained thereafter by the imaginary step 3/15. If it is found by the decision step 3/18 that none of the words at the locations where the errors have been detected to occur has the bit "1" error flag within subblock in question, it is deemed that there must exist other words each of which has been erroneously determined to be free from an error by the X-direction error-detection procedure A. In this instance, the errors in the actually erred words could not be located specifically although two or more of the words in the subblock in question have been given the bit "1" error flags and it has been determined that there are actually two or more words in error. Under these situations, the flag bits for all the data and error check words of the subblock are also neither reset to "0"s nor set to "1"s as indicated by the imaginary step 3/15. The flag bits of the words thus maintained by the imaginary step 3/15 are to be set or reset depending upon the results of the subsequent second X-direction error-detection procedure C. This is in consideration of the fact that, when there are three or more words having the bit "1" error flags within a certain Y-direction subblock, the subblock may contain three or more actually erred words and, if this occurs, both of the syndromes $S_{PY}$ and $S_{QY}$ may happen to be zero or any of the locations at which the errors occur as determined by the step 3/17 may happen to coincide with any of the words having the bit "1" error flags.

The steps 3/3 and 3/7 and the imaginary step 3/15 are followed by the second X-direction error-detection procedure C for detecting errors in the individual X-direction subblocks for a second time before correction of errors is accomplished in the Z-direction error-correction procedure D in the flowchart of FIG. 2.

In the Y-direction error-correction procedure B consisting of the steps 3/1 to 3/19 as hereinbefore described with reference to FIG. 3, the flag bits furnished to the data and error check words of each Y-direction subblock by the preceding X-direction error-detection procedure A are to be reset to "0"s in the following two cases:

(1) The subblock includes up to two (viz., zero, one or two) bit "1" error flags (step 3/1, 3/8 or 3/12) and both of the syndromes $S_{PY}$ and $S_{QY}$ are zero (step 3/2, 3/9 or 3/13). In this case, it is considered quite unlikely that the subblock in question includes an erred word.

(2) The subblock includes up to one (viz., zero or one) bit "1" error flag word (step 3/1 or 3/8) and at least one of the syndromes $S_{PY}$ and $S_{QY}$ is not zero (step 3/2 or 3/9) so that correction is made for one bit "0" error-free flag word (step 3/5) or one bit "1" error flag word (step 3/11). In this case, it is also considered that there is substantially no possibility of the subblock including an erred word after correction of the single word.

On the other hand, the flag bits furnished to the data and error check words of each Y-direction subblock are to be set to "1"s in the following two case:

(3) The subblock includes up to one (viz., zero or one) bit "1" error flag (step 3/1 or 3/8) and at least one of the syndromes $S_{PY}$ and $S_{QY}$ is not zero (step 3/2 or 3/9). None the less, there is no bit "1" error flag word at the location where an error has been detected to exist on the basis of syndromes $S_{PY}$ and $S_{QY}$ (step 3/5 or 3/11). In this case, it is considered quite likely that the subblock includes two or more words containing errors which have failed to be detected by the initial X-direction error-detection procedure A.

Furthermore, the flag bits are to be maintained, viz., neither reset to "0"s nor set to "1"s in the following three cases:

(4) The subblock includes two bit "1" error flags (step 3/12) and both of the syndromes $S_{PY}$ and $S_{QY}$ are zero (step 3/13) so that correction is made for the two bit "1" error flag words (step 3/14).

(5) The subblock includes three or more bit "1" error flags (step 3/12) and both of the syndromes $S_{PY}$ and $S_{QY}$ are zero (step (6) The subblock includes three or more bit "1" error flag words (step 3/12) and at least one of the syndromes $S_{PY}$ and $S_{QY}$ is not zero (step 3/16) so that correction is made for one of the three or more bit "1" error flag words (step 3/19).

In each of these last three cases, it is quite uncertain whether or not the subblock which has been accepted in the procedure A or corrected by the step 3/14 or 3/19 is actually free from errors and, if the subblock actually includes errors, these errors could not be located within the subblock. Detection of such errors is to be postponed until the subsequent second X-direction error-detection procedure C in the flowchart of FIG. 2.

Each of the data and error check words in the Y-direction subblocks thus corrected by the Y-direction error-correction procedure B is to be further inspected for errors in the second X-direction error-detection procedure C in the flowchart of 2. Because, in this instance, of the fact that the X-direction subblocks intersect the Y-direction subblocks in the word block shown in FIG. 1, the respective flags on the individual data and error check words in each of the X-direction subblocks to be checked in the second X-direction error-detection procedure C are in no respect correlated to one another. The data and error check words which have been checked for errors in the error-detection procedure C have flags which are determined as a result of the error correction by the Y-direction error-correction procedure B and further depending upon the results of the detection of errors by the subsequent second X-direction error-detection procedure C. Thus, the flag bits reset to "0"s and the flag bits set to "1"s in consequence of the Y-direction error-correction procedure B invariably assume the logic "0" and "1" bits, respectively, without respect to the results of the correction of errors by the subsequent second X-direction error-detection procedure C. Furthermore, the flag bits which have been neither reset to "0"s nor set to "1"s in the Y-direction error-correction procedure B are set to "1"s if the words are found to contain errors during the second X-direction error-detection procedure C and reset to "0"s if the words are found to be free from errors during the error-detection procedure C.

It will be understood that the data and error check words which have thus been processed in the successive procedures A, B and C in the flowchart of FIG. 2 are quite unlikely to still include such words that erroneously bear bit "1" error flags although the words are actually free from errors and such words that erroneously bear bit "0" error-free flags although the words actually contain errors. The data and error check words thus processed in the second X-direction error-detection procedure C are further corrected in the Z-direction subblocks by the subsequent Z-direction error-correction procedure D in the flowchart of FIG. 2. By this Z-direction error-correction procedure D, errors in the data and error check words in the Z-direction subblocks are corrected on the basis of the flags furnished to the words as a result of the correction and detection procedures B and C. The respective flags on the data and error check words in each of the Z-direction subblocks to be corrected in the Z-direction error-correction procedure D are in no respect correlated to one another since the Z-direction subblocks also intersect the X-direction subblocks. The Z-direction error-correction procedure D is accomplished generally similarly to the Y-direction error-correction procedure B described with reference to FIG. 3.

After the error detection and correction cycle consisting of the procedures A, B, C and D in the flowchart of FIG. 2 is repeated by the desired number of times J, detection of errors is further performed by the final X-direction error-detection procedure E for each of the X-direction subblocks. This final X-direction error-detection procedure E is intended for detecting the errors which have been finally determined to be irrecoverable as a result of the J number of detection and correction cycles. The error correcting operation by the prior-art method thus terminates upon completion of this final X-direction error-detection procedure E.

While the prior-art method of correcting errors is useful because of the extreme accuracy of correction thereby achievable as will have been understood from the foregoing description, such a method is nevertheless not fully acceptable.

FIG. 4 of the drawings schematically shows examples of the error and flag patterns on five parallel planes $M_1$ to $M_5$ having perpendicular dimensions respectively corresponding to the "Y" and "Z" directions of the word block illustrated in FIG. 1. In this FIG. 4, the intersections between the broken lines within each of these Y-Z planes $M_1$ to $M_5$ indicate correct words each having a bit "0" error-free flag furnished thereto as a result of the initial X-direction error-detection procedure A (FIG. 2). Symbols "o", "x" and "⊗" indicate flags with different states as, wherein the symbol "o" refers to a bit "0" error-free flag furnished to a word which is actually in error, the symbol "x" refers to a bit "1" error flag furnished to a word which is actually in error, and the symbol "⊗" refers to a bit "1" error flag furnished to a word which is actually correct. Thus, the flags represented by the symbols "o" and "⊗" are false flags and the flags represented by the symbol "x" alone are correct flags. The intersections which are left blank indicate bit "0" error-free flags furnished to word which are actually correct.

In view of the fact that Reed-Solomon codes for two error check words have the minimum length of 3, the syndromes ($S_{PU}$ and $S_{QU}$) may become zero when three or more erred words are included in a single subblock of the word block. When this occurs, the errors involved could not be detected on the basis of the syndromes. In the error and flag patterns on the Y-Z planes $M_1$ to $M_5$ shown in FIG. 4, one of the X-direction subblocks as represented by $X_1$ contains three erred words each bearing a bit "0" error-free flag. These particular words are those which could not be correctly detected by the initial X-direction error-detection procedure A in the flowchart of FIG. 2.

Figures 5A, 5B, 5C, 5D:
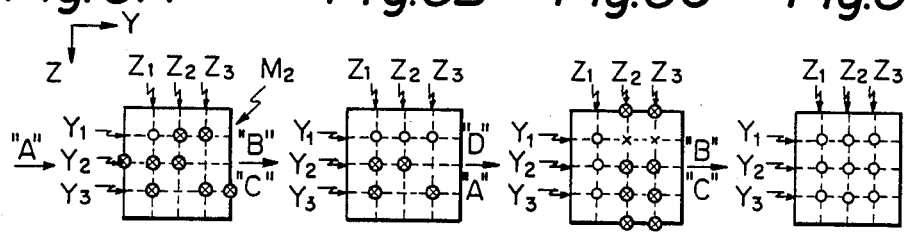
FIGS. 5A to 5D are diagrams schematically exemplifying the manners in which corrections are to be made for the error and flag pattern represented by one of the Y-Z planes illustrated in FIG. 4.

FIGS. 5A to 5D of the drawings exemplify the manners in which corrections are to be made for the error and flag pattern represented by the Y-Z plane $M_2$ which is assumed to include a single erred word bearing a bit "0" error-free flag "o" in a Y-direction subblock (denoted by $Y_1$). At the time when the detection of errors by the initial X-direction error-detection procedure A, this Y-Z plane $M_2$ is assumed to have the error and flag pattern as shown in FIG. 5A. As a result of the detection of errors by the second X-direction error-detection procedure C which is subsequent to the Y-direction error-correction procedure B, the error and flag pattern on the Y-Z plane $M_2$ under consideration may be changed to that shown in FIG. 5B. When the detection of errors by the third X-direction error-detection procedure C subsequent the first Z-direction error-correction procedure D is complete, the error and flag pattern on the Y-Z plane $M_2$ may be further changed as shown in FIG. 5C. Thereafter, the Y-Z plane $M_2$ may have the error and flag pattern as shown in FIG. 5D as a result of the detection of errors by the fourth X-direction error-detection procedure C which is subsequent to the second Y-direction error-correction procedure B.

It is now assumed that, at the end of the first X-direction error-detection procedure A, there are two words each bearing a bit "1" error flag "⊗" in the Y-direction subblock $Y_1$ in which the word with the flag "o" is located on the Y-Z plane $M_2$ as shown in FIG. 5A. These two words are to be corrected by the first Y-direction error-correction procedure B subsequent to the first X-direction error-detection procedure A (step 3/14 in FIG. 3). This correction is however apparently false since the particular words are actually correct although they have been given the bit "1" error flags. Similar false correction will be made for the error and flag patterns on another Y-Z plane including a single word bearing a bit "0" error-free flag "o" and two words each bearing a bit "1" error flag "⊗" in the Y-direction subblock $Y_1$, such as the planes $M_3$ and $M_4$ as shown in FIG. 4. When the false correction is thus made for the two words each bearing the bit "0" error-free flag "o" in the Y-direction subblock $Y_1$ on each of the three Y-Z planes $M_2$, $M_3$ and $M_4$, two of the X-direction subblocks will contain each three falsely corrected words. As will be seen from FIG. 5B, these falsely corrected words could not be detected to be in error within the X-direction subblocks in part because the errors created by the false correction have resulted from the errors which could not be coped with by the next X-direction error-detection procedure C. An additional reason for which the falsely corrected words could not be detected to be in error within the X-direction subblocks is that the Reed-Solomon codes are intrinsically linear codes.

The Y-Z plane $M_2$ is herein further assumed to include three words which are given bit "1" error flags " " within each of the Y-direction subblocks $Y_2$ and $Y_3$ thereon. Two of these three words within the subblock $Y_2$ are assumed to be respectively included in the X-direction subblocks $X_2$ and $X_3$ each including a word bearing bit "1" error flag "x" on each of the Y-Z planes $M_1$ and $M_5$ as shown in FIG. 4. Likewise, two of the three words within the subblock $Y_3$ are assumed to be respectively included in the X-direction subblocks $X_4$ and $X_5$ each including a word bearing bit "1" error flag "x" on each of the Y-Z planes $M_1$ and $M_5$ as shown. These three words within each of the subblocks $Y_2$ and $Y_3$ being actually correct, both of the syndromes ($S_{PY}$ and $S_{QY}$) for each of the Y-direction subblock $Y_2$ and $Y_3$ become zero. Two of these three words each with the flag "x" are included in the error pattern including a single word with the flag "⊗" in addition to two words each with the flag "x" as in each of the subblock $Y_2$ on the Y-Z plane $M_1$ and the subblock $Y_3$ on the Y-Z plane $M_5$. The particular two words each with the flag "x" are not corrected by the first Y-direction error-correction procedure B so that the bit "1" error flags "⊗" of the words are maintained at the end of the second X-direction error-detection procedure C subsequent to the first Y-direction error-correction procedure B as will be seen from FIG. 5B. It may be mentioned that, in this instance, the flag bit of the remaining one of the three actually correct words each bearing the bit "1" error flag "⊗" in each of the Y-direction subblocks $Y_2$ and $Y_3$ is correctly reset to "0"s as a result of the first Y-direction error-correction procedure B as indicated by the blank intersection on the Y-Z plane $M_2$ in FIG. 5B.

As a result of the first Z-direction error-detection procedure D subsequent to the second X-direction error-correction procedure C, the Y-Z plane $M_2$ has two actually correct words each bearing the bit "1" error flag " " in the Z-direction subblock $Z_1$ as shown in FIG. 5B. False correction will thus be made on these two words as will be seen from from comparison between FIGS. 5B and 5C, as has been the case with the Y-direction subblock $Y_1$. This false correction is made by a process step equivalent to the step 3/14 of the Y-direction error-correction procedure shown in FIG. 3. In each of the other Z-direction subblocks represented by $Z_2$ and $Z_3$ are thus included a single falsely corrected word bearing the bit "0" error-free flag "o" and a single actually correct word bearing the bit "1" error flag "⊗" as also shown in FIG. 5B. Correction of the falsely corrected word bearing the bit "0" error-free flag "o" can not however be made by the Z-direction error-correction procedure D. The flag bits of all the words in each of these Z-direction subblocks are thus set to "1"s by a step equivalent to the step 3/7 of the Y-direction error-correction procedure shown in FIG. 4. As consequence, the bit "0" error-free flag "o" is changed to a bit "1" error-free flag "x" and the bit "1" error-free flags "⊗" are maintained at the end of the first Z-direction error-correction procedure D as will be also seen from FIG. 5C.

The actually incorrect word bearing the bit "0" error-free flag "o" in each of the Z-direction subblocks $Z_2$ and $Z_3$ could be corrected in this first Z-direction error-correction procedure D. In this instance, however, false correction would be made for not only the Y-direction subblock $Y_1$ but also the Y-direction subblocks $Y_2$ and $Y_3$ as a result of the second Y-direction error-correction procedure B subsequent to the third X-direction error-detection procedure C. This is because of the fact that all the flag bits of the words in the Z-direction subblocks $Z_2$ and $Z_3$ must have been set to "1"s by the first Z-direction error-correction procedure D. Such false correction will lead to inability of detection of a total of 27 incorrect words within the word block as a whole. These erred words could not in the least be recovered by repetition of the detection and correction cycles thereafter.

From the above description it will have been understood that the prior-art method of correcting errors as carried out by following the procedures shown in FIG. 2 and the steps shown in FIG. 4 could not satisfactorily cope with such error and flag patterns that are described with reference to FIG. 4. Though not herein discussed, furthermore, there are other kinds of important and frequently possible errors which the prior-art method of correcting errors could not correct properly. A prime object of the present invention is to provide an improved method of correcting errors which is operable for coping with not only the error pattern described with reference to FIG. 4 but also the various important error patterns other than such an error pattern.

FIGS. 6A to 6D, which correspond to FIGS. 5A to 5D, respectively, exemplify a modified error correction procedure to correct errors in the error and flag pattern represented by the Y-Z plane $M_2$ in FIG. 4. In the modified procedure, the flag bits of all the words in each of the Y-direction subblocks are set to "1"s after the two data words each having the bit "1" error flag are corrected on the basis of the syndromes $S_{PY}$ and $S_{QY}$ by the step 3/14 in the procedure B shown in FIG. 3. As discussed with reference to FIGS. 5A to 5D, this Y-Z plane $M_2$ is assumed to have the error and flag pattern including a single erred word bearing a bit "0" error-free flag "o" and two words each bearing a bit "1" error flag "⊗" in the Y-direction subblock $Y_1$.

By the first Y-direction error-correction procedure B subsequent to the first X-direction error-detection procedure A (step 6/14 in FIG. 3), the two words each bearing the bit "1" error flag "⊗" in the Y-direction subblock $Y_1$ are corrected. This correction is however false since the particular words are actually correct although they have been given the bit "1" error flags. When the flag bits of all the words in each of the Y-direction subblocks including the additional two erred words resulting from the false correction are set to "1"s, the flag bit of the word with the bit "0" error-free flag "o" and the flag bits of the falsely corrected words initially having the bit "1" error flags "⊗" are changed to bit "1" error flags "x". Furthermore, the flags of the words at the blank intersections in the subblock $Y_1$ are changed to bit "1" error flags "⊗". The Y-Z plane $M_2$ is further assumed to include three words each with a bit "1" error flag "⊗" within each of the Y-direction subblocks $Y_2$ and $Y_3$ thereon. As also previously discussed, two of these three words each with the flag "x" are not corrected by the first Y-direction error-correction procedure B so that the bit "1" error flags "⊗" of the words are maintained at the end of the second X-direction error-detection procedure C in each of the Y-direction subblocks $Y_2$ and $Y_3$ as will be seen from FIG. 6B.

Figures 6A, 6B, 6C, 6D:
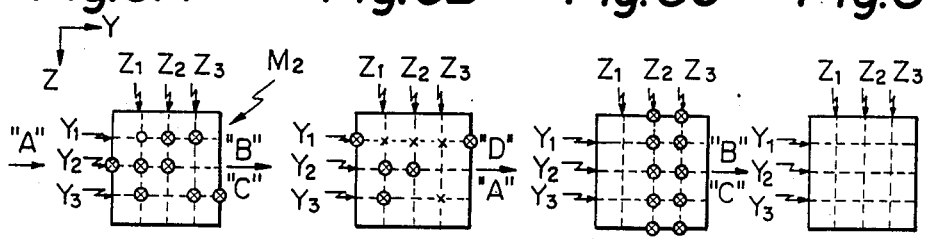
FIGS. 6A to 6D are diagrams corresponding to FIGS. 5A to 5D, respectively, and exemplify a modified error correction procedure to correct errors in the error and flag pattern represented by one of the Y-Z planes shown in FIG. 4.

By the first Z-direction error-detection procedure D subsequent to the second X-direction error-correction procedure C, the single word with the bit "1" error flag "⊗" in the Z-direction subblock $Z_1$ is corrected as shown in FIG. 6C, the flag bits of the words in the subblock $Z_1$ being determined depending upon the result of the subsequent second X-direction error-detection procedure C. In each of the Z-direction subblocks $Z_2$ and $Z_3$, the two words consisting of the single word with the bit "1" error flag "⊗" and the single word with the bit "1" error flag "x" are corrected and the flag bits of all the words are set to "1"s so that all the words have the bit "1" error flag "x" as shown in FIG. 6C. During the Z-direction error-correction procedure D are also corrected the two words each with a bit "1" error flag "x" in the error pattern including a single word with a bit "1" error flag "⊗" and two words each with a bit "1" error flag "x" in each Y-direction subblocks $Z_2$ and $Z_3$ on other Y-Z planes. All the erred words in each of the Z-direction subblocks $Z_1$, $Z_2$ and $Z_3$ are thus corrected at the end of the Z-direction error-correction procedure D. By the subsequent third X-direction error-detection procedure C, the flag bits of all the words in the subblock $Z_1$ are reset to "0"s and the flag bits of all the words in each of the subblocks $Z_2$ and $Z_3$ are maintained in "0" states, as will be also seen from FIG. 6C. By the second Y-direction error-correction procedure C subsequent to the third X-direction error-detection procedure C, the flag bits of all the words on the Y-Z plane $M_2$ are reset to "0"s in the absence errors on the particular plane $M_2$ as shown in FIG. 6D.

The modified error correction procedure as above described is successful for the correction of the errors of the pattern represented by the Y-Z plane $M_2$ but is not operable for the correction of errors patterned as represented by the Y-Z plane shown in FIG. 7A. This Y-Z plane is assumed to have an error and flag pattern including a single word with a bit "1" error flag "x" and a single word with a bit "1" error flag "⊗" in the Y-direction subblock $Y_1$ and three erred words each with a bit "1" error flag "x" in each of the Y-direction subblocks $Y_2$ and $Y_3$.

By the first Y-direction error-correction procedure B subsequent to the first X-direction error-detection procedure A, the single erred word with the bit "1" error flag "x" and the single correct word with the bit "1" error flag "⊗" in the Y-direction subblock $Y_1$ are corrected so that all the words in the subblock have bit "1" error flags "⊗" as shown in FIG. 7B. On the other hand, the three erred words each with the bit "1" error flag "x" in each of the Y-direction subblocks $Y_2$ and $Y_3$ remain unchanged as also shown in FIG. 7B. At the end of the second X-direction error-detection procedure C subsequent to the first Y-direction error-correction procedure B, each of the Z-direction subblocks $Z_1$, $Z_2$ and $Z_3$ thus includes a single word with the bit "1" error flag "⊗" and two words each with the bit "1" error flag "x". It is herein assumed for purposes of explanation that the location of the error as determined on the basis of the syndromes $S_{PZ}$ and $S_{QZ}$ happens, by a mere chance, to corresponds to the word with the bit "1" error flag "x" only in each of the subblocks $Z_2$ and $Z_3$ during the subsequent first Z-direction error-correction procedure D. In this instance, the two erred words each with the bit "1" error flag "x" in the subblock $Z_1$ could not be corrected by the first Z-direction error-correction procedure D and thus remain unchanged after the third X-direction error-detection procedure A as will be seen from FIG. 7C. The single word with the bit "1" error flag "⊗" in the subblock $Z_1$ is given the bit "0" error-free flag as a result of the third X-direction error-detection procedure A as will be also seen from FIG. 7C. In each of the subblocks $Z_2$ and $Z_3$, however, the single word with the bit "1" error flag "⊗" is falsely corrected in the presence of the two erred words each with the bit "1" error flag "x" by the first Z-direction error-correction procedure D. The result is that each of the subblocks $Z_2$ and $Z_3$ includes three erred words each with the bit "1" error flag "x" after the third X-direction error-detection procedure A as shown in FIG. 7C. During the subsequent second Y-direction error-correction procedure B, the two words each with the bit "1" error flag "x" in the Y-direction subblock $Y_1$ are corrected and the flag bits of all the words in the subblock are set to "1"s so that all the words in the particular subblock $Y_1$ have the bit "1" error flag "⊗". On the other hand, the three words each with the bit "1" error flag "x" in each of the Y-direction subblocks $Y_2$ and $Y_3$ remain unchanged. The resultant error and flag pattern is identical with that produced after the second X-direction error-detection procedure C was complete and is none but the pattern shown in FIG. 7B. Further correction of errors would thus result in mere repetition of the error and flag patterns shown in FIGS. 7B and 7C and could not lead to recovery of the correct information.

The errors represented by the pattern shown in FIG. 7A can be corrected completely when the steps shown in FIG. 3 are followed. In the steps shown in FIG. 3, the flag bits of the words in the Y-direction subblocks $Y_1$ are not set to "1"s after correction of the errors in the particular subblock by the first Y-direction error-correction procedure B as previously discussed. Thus, each of the Z-direction subblocks $Z_1$, $Z_2$ and $Z_3$ has the error and flag pattern including two words each with a bit "1" error flag " " enabling all the erred words to be corrected completely.

DETAILED DESCRIPTION OF THE INVENTION

A first preferred example of a method of correcting errors according to the present invention will be hereinafter described with reference to FIG. 8 of the drawings. The shown example of a method of correcting errors according to the present invention also uses the word block illustrated in FIG. 1 and includes all the procedures A, B, C, D and E shown in the flowchart of FIG. 2. Of these procedures A to E in the example of a method according to the present invention, the first, second and final X-direction detection procedures A, C and E are similar to those in the prior-art method of correcting errors. A method according to the present invention is thus characterized over the prior-art method of correcting errors by the Y-direction and Z-direction correction procedures B and D. The Z-direction error-correction procedure D is essentially similar to the Y-direction error-correction procedure B except in that correction of errors is to be made solely in the Z-direction subblocks in the former while correction of errors is to be made solely in the Y-direction subblocks in the latter.

The Y-direction error-correction procedure B in the example of a method according to the present invention as shown in FIG. 8 is largely similar to the procedure described with reference to FIG. 3. In FIG. 8, the various process and decision steps having their exact equivalents in the procedure shown in FIG. 3 are thus indicated by the same numerals as in FIG. 3 with a common numerical prefix 8 over a slash mark. The procedure B in the example of a method according to the present invention as shown in FIG. 8 differs from the procedure of FIG. 3 in the steps to follow the process step 8/14.

When there are two or more bit "1" error flag words included in the data and error check words in a Y-direction subblock, it is determined by the decision step 8/12 whether or not there are two, and only two, bit "1" error flag words within the subblock in question. If the answer in this step 8/12 is in the affirmative "YES", it is further determined by the subsequent decision step 8/13 whether or not both of the syndromes $S_{PY}$ and $S_{QY}$ for the Y-direction subblock including the two bit "1" error flag words are zero. If both of the syndromes $S_{PY}$ and $S_{QY}$ are found to be zero for the particular subblock, it is deemed that there actually are no errors occurring in the subblock and, thus, the flag bits for all the data and error check words of the subblock are reset to "0"s by the step 8/3 as in the procedure described with reference to FIG. 3.

If it is found by the decision step 8/13 that at least one of the syndromes $S_{PY}$ and $S_{QY}$ is not zero for the Y-direction subblock in question, it is deemed that the two data words each having the bit "1" error flag are actually in error. The decision step 8/12 is thus followed by the step 8/14 to correct these errors on the basis of the syndromes $S_{PY}$ and $S_{QY}$ in accordance with Equations 9 and 10 with the error locations i and j represented by the particular two words. In the procedure described with reference to FIG. 3, the flag bits for all the data and error check words of the subblock are neither reset to "0"s nor set to "1"s by the imaginary step 3/15 and are to be set or reset depending on the results of the subsequent X-direction error-detection procedure C of the flowchart of FIG. 2. If it happens that the subblock in question includes errors which have not been detected by the initial X-direction error-detection procedure A, then false correction is made by the step 8/14 for the two actually correct words and, as a consequence, the particular subblock will have three erred words including the two falsely corrected words, thus making it impossible to correct the initial erred word.

In the Y-direction error-correction procedure B shown in FIG. 6, the flag bits of all the words in the subblock are either set to "1"s or neither set to "1"s nor reset to "0"s depending upon whether the Y-direction error-correction procedure B has been executed up to two times or three or more times prior to the current Y-direction error-correction procedure B. This is determined by an additional decision step 8/20 subsequent to the correction step 14. If it is thus found in the decision step that the Y-direction error-correction procedure B has been executed up to two times, viz., the number of the error detection and correction cycles I (FIG. 2) which have been repeated is not more than one, then the flag bits in all the data and error check words of the Y-direction subblock in question are set to "1"s by the step 8/3. If, on the contrary, it is found in the decision step that the Y-direction error-correction procedure B has been executed three or more times, viz., the number of the error detection and correction cycles I which have been repeated is not less than two, then the flag bits of all the data and error check words in the Y-direction subblock are neither set to "1"s nor reset to "0"s by the imaginary step 8/15. If the words in an error and flag pattern containing non-detected errors as in the pattern represented by the Y-Z plane $M_2$ shown in FIG. 4 may have been falsely corrected by the end of the first or second Y-direction error-detection procedures B, the flag bits of all the words in the subblock are thus set to "1"s and, for this reason, there could be no additional non-detected errors created in the subblock. All the errors in the error and flag pattern represented by the Y-Z plane $M_2$ shown in FIG. 4 can therefore be properly corrected by the time when the second Y-direction error-detection procedures B is complete. In the absence of non-detected errors in the error and flag pattern of the subblock in question during the first or second Y-direction error-detection procedures B, the flag bits of all the words in the subblock in question are set to "1"s after the correction of errors has been made properly by the step 8/14. This adds to the number of the words which are free from error and which are none the less given bit "1" error flags. By reason of these added actually correct bit "1" flag words, the actual errors in the subblock containing such words may not be corrected by the second Y-direction error-correction procedure B. The flag bits of the words being not set to "1"s by the subsequent Y-direction error-correction procedures B, the error and flag pattern thus including the uncorrectable errors is converted into a pattern with correctable errors by the third and possibly further subsequent Y-direction error-correction procedures B until the erred words are finally corrected properly.

In accordance with the Y-direction error-correction procedure hereinbefore described with reference to FIG. 8, the flag bits of the words in the subblock are either set to "1"s or neither set to "1"s nor reset to "0"s depending upon the number of the times the Y-direction error-correction procedure B has been executed. If desired, such a procedure may be modified so that the flag bits of only those words which have been corrected by the step 8/14 are set to "1"s by the step 8/7 depending upon the number of the times the Y-direction error-correction procedure B has been executed. In this instance, the flag bits of the words in the subblock may be set to "1"s or neither set to "1"s nor reset to "0"s also depending upon the number of the times the Y-direction error-correction procedure B has been executed. The procedure described with FIG. 8 may be otherwise modified so that the flag bits of all the words in a Y-direction subblock are neither set to "1" nor reset to "0" without respect to the number of the times the Y-direction error-correction procedure B has been executed if it is found that the location of the error as determined on the basis of the syndromes $S_{PY}$ and $S_{QY}$ corresponds to one of the two words each with the bit "1" error flag. The modified procedure will also provide acceptable final results of correction since it is quite likely that the particular word corresponding to the location of the error as determined by the syndromes $S_{PY}$ and $S_{QY}$ is in err and the other of the two words in question is free from error and, furthermore, it is quite unlikely that false correction may be effected due to the existence of a non-detected error in the particular subblock.

When the error correction procedure described as above with reference to FIG. 8 is used, the errors in the error and flag patterns represented by the Y-Z planes $M_1$ to $M_5$ shown in FIG. 4 are corrected in a manner described with reference to FIGS. 6A to 6D. Likewise, the errors in the error and flag pattern represented by the Y-Z planes shown in FIG. 7A are corrected in a manner described with reference to FIGS. 9A to 9G.

FIGS. 9A to 9G exemplify a manner in which corrections are to be made for the error and flag pattern represented by the Y-Z plane $M_2$ which is assumed to include a single erred word bearing a bit "1" error flag "x" and a single correct word bearing a bit "1" error flag " " in the Y-direction subblock $Y_1$. The pattern shown in FIG. 9A is produced as a result of the first X-direction error-detection procedure A. The pattern shown in FIG. 9B is produced as a result of the second X-direction error-detection procedure C subsequent to the first Y-direction error-correction procedure B ($B_1$). The pattern shown in FIG. 9C is produced as a result of the third X-direction error-detection procedure A subsequent to the first Z-direction error-correction procedure D ($D_1$). The pattern shown in FIG. 9D is produced as a result of the fourth X-direction error-detection procedure C subsequent to the second Y-direction error-correction procedure B ($B_2$). The pattern shown in FIG. 9E is produced as a result of the fifth X-direction error-detection procedure A subsequent to the second Z-direction error-correction procedure D ($D_2$) The pattern shown in FIG. 9F is produced as a result of the sixth X-direction error-detection procedure C subsequent to the third Y-direction error-correction procedure B ($B_3$). Lastly, the pattern shown in FIG. 9G is produced as a result of the seventh X-direction error-detection procedure A subsequent to the third Z-direction error-correction procedure D ($D_3$).

By the first Y-direction error-correction procedure B subsequent to the first X-direction error-detection procedure A, the single erred word with the bit "1" error flag "x" and the single correct word with the bit "1" error flag "⊗" in the Y-direction subblock $Y_1$ are corrected so that all the words in the subblock have bit "1" error flags "⊗" as shown in FIG. 9B. On the other hand, the three erred words each with the bit "1" error flag "x" in each of the Y-direction subblocks $Y_2$ and $Y_3$ remain unchanged as also shown in FIG. 9B. By the second X-direction error-detection procedure C subsequent to the first Y-direction error-correction procedure B, each of the Z-direction subblocks $Z_1$, $Z_2$ and $Z_3$ thus includes a single word with the bit "1" error flag " " and two erred words each with the bit "1" error flag "x". If the location of the error as determined on the basis of the syndromes $S_{PZ}$ and $S_{QZ}$ corresponds to the word with the bit "1" error flag "x" only in each of the subblocks $Z_2$ and $Z_3$ during the subsequent first Z-direction error-correction procedure D, the two words each with the bit "1" error flag "x" in the subblock $Z_1$ remain unchanged after the third X-direction error-detection procedure A. The single word with the bit "1" error flag "⊗" in the subblock $Z_1$ is given the bit "0" error-free flag as a result of the third X-direction error-detection procedure A as shown in FIG. 9C. In each of the subblocks $Z_2$ and $Z_3$, the single word with the bit "1" error flag "⊗" is falsely corrected in the presence of the two words each with the bit "1" error flag "x" by the first Z-direction error-correction procedure D. The result is that each of the subblocks $Z_2$ and $Z_3$ includes three words each with the bit "1" error flag "x" after the third X-direction error-detection procedure A as shown in FIG. 9C. During the subsequent second Y-direction error-correction procedure B, the two words each with the bit "1" error flag "x" in the Y-direction subblock $Y_1$ are corrected and the flag bits of all the words in the subblock are set to "1"s so that all the words in the particular subblock $Y_1$ have the bit "1" error flag "⊗" as shown in FIG. 9D. On the other hand, the three words each with the bit "1" error flag "x" in each of the Y-direction subblocks $Y_2$ and $Y_3$ remain unchanged as also shown in FIG. 9D. The error and flag pattern shown in FIG. 9D is identical with that produced when the second X-direction error-detection procedure C was complete and accordingly with the pattern shown in FIG. 9B. Thus, the result obtained by the fifth X-direction error-detection procedure A subsequent to the second Z-direction error-correction procedure D ($D_2$) is identical with that obtained after the third X-direction error-detection procedure A and accordingly with the pattern shown in FIG. 9C.

At the end of the subsequent third Y-direction error-correction procedure B ($B_3$), the two words each with the bit "1" error flag "⊗" are corrected in the Y-direction subblock $Y_1$ and the flag bits of all the words in the subblock are neither set to "1"s nor reset to "0"s. It therefore follows that all the words in the subblock $Y_1$ have bit "0" error-free flags at the end of the sixth X-direction error-detection procedure C subsequent to third Y-direction error-correction procedure B ($B_3$), as will be seen from FIG. 9F. In each of the subblocks $Y_2$ and $Y_3$, only the words each with the bit "1" error flag "⊗" remain unchanged as will be also seen from FIG. 9F. By the third Z-direction error-correction procedure D ($D_3$) subsequent to this sixth X-direction error-detection procedure C, the two words each with the bit "1" error flag "⊗" in each of the Z-direction subblocks $Z_1$, $Z_2$ and $Z_3$ are corrected and as a consequence all the erred words are corrected properly as will be seen from FIG. 9G. It may be herein noted that the flag bits of all the words in each of the subblocks $Z_1$, $Z_2$ and $Z_3$ are neither set to "1"s nor reset to "0"s during the third Z-direction error-correction procedure D ($D_3$) but are to be reset to "0"s by the subsequent seventh X-direction error-detection procedure A.

Another preferred example of a method of correcting errors according to the present invention will be hereinafter described with reference to FIG. 10 of the drawings. The shown example of a method of correcting errors according to the present invention also uses the X-word block illustrated in FIG. 1 and includes all the procedures A, B, C, D and E in the flowchart of FIG. 2. The Y-direction error-correction procedure B in the example of a method according to the present invention as shown in FIG. 10 is also largely similar to the procedure described with reference to FIG. 3. The various process and decision steps having their exact equivalents in the procedure shown in FIG. 3 are thus indicated by the same numerals as in FIG. 3 with a common numerical prefix 10 over a slash mark. The procedure B in the example of a method according to the present invention as shown in FIG. 10 differs from the procedure of FIG. 3 in the steps to follow the decision step 10/11.

As described with reference to FIG. 3, it is determined by the decision step 10/8 whether or not there is one, and only one, bit "1" error flag word included in the Y-direction subblock. If the answer in this step 10/8 is in the affirmative "YES", it is further determined by the decision step 10/9 whether or not both of the syndromes $S_{PY}$ and $S_{QY}$ for the Y-direction subblock including the single bit "1" error flag word are zero. If both of the syndromes $S_{PY}$ and $S_{QY}$ are found to be zero for the particular subblock, it is deemed that there are no errors occurring in the subblock and, thus, the flag bits for all the data and error check words of the subblock are reset to "0"s by the step 10/3. The flag bits thus reset by the step 10/3 are maintained during the subsequent error-detection procedure C even if errors might be detected to occur in the X-direction subblock in question as previously noted. If it is found as a result of the decision step 10/9 that at least one of the syndromes $S_{PY}$ and $S_{QY}$ is not zero for the Y-direction subblock in question, the location (i) of the error within the particular subblock is determined by the step 10/10 from the syndromes $S_{PY}$ and $S_{QY}$ (Equation 13). Thereupon, it is determined by the decision step 10/11 whether or not the word at the location (i) where the error has been detected to occur has the bit "1" error flag within the subblock in question. When the answer in this decision step 10/11 is in the affirmative "YES" meaning that the word at the particular location has the bit "1" error flag, it is deemed that the data word has been erroneously determined to be free from error during the initial X-direction error-detection procedure A. In this instance, the decision step 10/11 is followed by the process step 10/6 to correct the error in the data word in question. When the correction of the error is complete, it is decided that errors are no longer included in the Y-direction subblock in question and the flag bits for all the data and error check words of the subblock are reset to "0"s by the step 10/3. These steps beginning with the decision step 10/8 and ending with the reset step 10/3 are thus similar to those intervening between the steps 3/6 and 3/3 in the procedure described with reference to FIG. 3.

If the word at the location of the detected error is found to have the bit "0" error-free flag, it is assumed in the procedure of FIG. 10 that there must exist another word erroneously determined to be correct during the X-direction error-detection procedure A as previously described. The flag bits for all the data and error check words of the subblock are thus set to "1"s. In contrast to such an assumption taken in the prior-art method, it is deemed in the procedure B of FIG. 10 that, if the location (i) of the detected error does exist within the subblock in question, the particular data word must be the very word that has been regarded correct by the X-direction error-detection procedure A and, accordingly, the word bearing the bit "1" error flag is correct and free from error. When the answer in the decision step 10/11 is in the negative "NO", the step 10/11 is thus followed by the decision step 10/20 determine whether or not the location (i) at which the error has been detected to occur actually exists within the Y-direction subblock in question. When it is found by this decision step 10/20 that such a location actually exists in the subblock, it is deemed that the particular data word is the very word that has been regarded free from error during the initial X-direction error-detection procedure A in the flowchart of FIG. 2. Accordingly, the decision step 10/20 is followed by the process step 10/19 to correct the error in the actually erred data word and the flag bits for all the data and error check words of the subblock are maintained, viz., neither reset to "0"s nor set to "1"s thereafter by the imaginary step 10/15. The flag bits of the words thus maintained by the imaginary step 10/15 are to be set or reset depending upon the results of the subsequent second X-direction error-detection procedure C. It has been described in connection with the procedure shown in FIG. 3 that correction of the word with the bit "1" error flag as discussed above might be made with use of the syndromes $S_{PY}$ and $S_{QY}$ provided the flag bits for all the data and error check words of the subblock are to be set to "1"s thereafter. In the procedure B of the method according to the present invention, it is deemed that correction of errors relying on the syndromes $S_{PY}$ and $S_{QY}$ alone is impossible and, from this standpoint, the flag bits of all the data and error check words of the subblock are set to "1"s when the location (i) at which the error has been detected to occur does not exist within the Y-direction subblock in question. This is based on the presumption that there must exist another erred word though such a word has not been detected and the word bearing the bit "1" error flag is erred in reality if the location of the detected error corresponds to none of the words within the particular subblock.

There is a case where correction of a word becomes false when the correction is made under such conditions that there is only one word bearing the bit "1" error flag within a Y-direction subblock and concurrently the word at the location determined on the basis of the syndromes $S_{PY}$ and $S_{QY}$ for the subblock has the bit "0" error-free flag. The probability of such a case occurring is however sufficiently low as compared to the probabilities that false corrections of other natures may occur. In addition, the false correction occurring under such conditions can be recovered since the flag furnished to the falsely corrected word is dictated by the result of the subsequent X-direction error-detection procedure C (FIG. 2) so that the particular word can be detected by the procedure C. Because, furthermore, of the fact that the flag bit of the bit "0" error-free flag word is not set to "1"s during the Y-direction error-correction procedure B of FIG. 10, there could be no possibility that another word is given a bit "1" error flag although the word is free from error. The method according to the present invention hereinbefore described with reference to FIG. 10 thus excels the prior-art method of correcting errors particularly when there is an erred word which has not been detected by the initial X-direction error-detection procedure A (FIG. 2).

FIGS. 11A to 11D of the drawings exemplify the manner in which correction is to be made for the error and flag pattern represented by the Y-Z plane $M_2$ in FIG. 4 by the method described with reference to FIG. 10.

At the time when the detection of errors by the initial X-direction error-detection procedure A, this Y-Z plane $M_2$ is assumed to have the error and flag pattern as shown in FIG. 11A. As a result of the detection of errors by the second X-direction error-detection procedure C which is subsequent to the first Y-direction error-correction procedure B, the error and flag pattern on the Y-Z plane $M_2$ under consideration may be changed to that shown in FIG. 11B. When the detection of errors by the third X-direction error-detection procedure C subsequent the first Z-direction error-correction procedure D is complete, the error and flag pattern on the Y-Z plane $M_2$ may be further changed as shown in FIG. 11C. Thereafter, the Y-Z plane $M_2$ may have the error and flag pattern as shown in FIG. 11D as a result of the detection of errors by the fourth X-direction error-detection procedure C which is subsequent to the second Y-direction error-correction procedure B.

By the first Y-direction error-correction procedure B subsequent to the first X-direction error-detection procedure A (step 11/14 in FIG. 11), the two words each bearing the bit "1" error flag "⊗" in the Y-direction subblock $Y_1$ are corrected as shown in FIG. 11B. This correction is however false since the particular words are actually correct although they have been given the bit "1" error flags. As discussed previously, these falsely corrected words could not be detected to be in error within the X-direction subblocks. The Y-Z plane $M_2$ is further assumed to include three words each with a bit "1" error flag "⊗" within each of the Y-direction subblocks $Y_2$ and $Y_3$ thereon. As also previously discussed, two of these three words each with the flag "x" are not corrected by the first Y-direction error-correction procedure B so that the bit "1" error flags "⊗" of the words are maintained at the end of the second X-direction error-detection procedure C as will be seen from FIG. 11B.

As a result of the first Z-direction error-detection procedure D subsequent to the second X-direction error-correction procedure C, the Y-Z plane $M_2$ has two words each bearing the bit "1" error flag "⊗" in the Z-direction subblock $Z_1$ as shown in FIG. 11B. False correction is thus made on these two words as will be seen from FIG. 11C. In each of the Z-direction subblocks $Z_2$ and $Z_3$, the single word bearing the bit "0" error-free flag "o" is corrected by the first Z-direction error-correction procedure D as will be seen from FIG. 11C. The flag bits of the words in each of the subblocks $Z_2$ and $Z_3$ are determined by the result of the subsequent third X-direction error-detection procedure C. During the Z-direction error-correction procedure D preceding this third X-direction error-detection procedure C are also corrected the two words each with a bit "1" error flag "x" in the error pattern including a single word with a bit "1" error flag "⊗" and two words each with a bit "1" error flag "x" in each of the Y-direction subblocks $Z_2$ and $Z_3$ on other Y-Z planes. By the third X-direction error-detection procedure C, the flag bits of all the words in each of the Z-direction subblocks $Z_2$ and $Z_3$ are thus reset to "0"s as will be also seen from FIG. 11C. By the second Y-direction error-correction procedure C subsequent to the third X-direction error-detection procedure C, all the actually erred words each with the bit "0" error-free flag "o" in the Y-direction subblocks $Y_1$, $Y_2$ and $Y_3$ on the Y-Z planes $M_2$ are corrected as will be also seen from FIG. 11D. Thus, all the erred words contained in the Y-Z plane $M_2$ are properly corrected as a result of this second Y-direction error-correction procedure C.

A third preferred example of a method of correcting errors according to the present invention will now be described with reference to FIG. 12 of the drawings. The Y-direction error-correction procedure B in the example of a method according to the present invention as shown in FIG. 12 is also largely similar to the procedure described with reference to FIG. 3. The various process and decision steps having their exact equivalents in the procedure shown in FIG. 3 are thus indicated by the same numerals as in FIG. 3 with a common numerical prefix 12 over a slash mark. The procedure B in the example of a method according to the present invention as shown in FIG. 11 differs from the procedure of FIG. 3 in the steps to follow the error correction step 12/14.

When there are two or more bit "1" error flag words included in the data and error check words in a Y-direction subblock, it is determined by the decision step 12/12 whether or not there are two, and only two, bit "1" error flag words within the subblock in question. If the answer in this step 12/12 is in the affirmative "YES", it is further determined by the subsequent decision step 12/13 whether or not both of the syndromes $S_{PY}$ and $S_{QY}$ for the Y-direction subblock including the two bit "1" error flag words are zero. If both of the syndromes $S_{PY}$ and $S_{QY}$ are found to be zero for the particular subblock, it is deemed that there actually are no errors occurring in the subblock and, thus, the flag bits for all the data and error check words of the subblock are reset to "0"s by the step 12/3 as in the procedure described with reference to FIG. 3.

If it is found by the decision step 12/13 that at least one of the syndromes $S_{PY}$ and $S_{QY}$ is not zero for the Y-direction subblock in question, it is deemed that the two data words each having the bit "1" error flag are actually in error. The decision step 12/12 is thus followed by the step 12/14 to correct these errors on the basis of the syndromes $S_{PY}$ and $S_{QY}$ in accordance with Equations 9 and 10 with the error locations i and j represented by the particular two words. In the procedure described with reference to FIG. 3, the flag bits for all the data and error check words of the subblock are neither reset to "0"s nor set to "1"s by the imaginary step 3/15 and are to be set or reset depending upon the results of the subsequent X-direction error-detection procedure C of the flowchart of FIG. 2. If it happens that the subblock in question includes errors which have not been detected by the initial X-direction error-detection procedure A, then false correction is made by the step 12/14 for the two actually correct words and, as a consequence, the particular subblock will have three erred words including the two falsely corrected words, thus making it impossible to correct the initial erred word.

In the Y-direction error-correction procedure B shown in FIG. 12, the flag bits of all the words in the subblock are set to "1"s without respect to the number of the error detection and correction cycles I (FIG. 2) which have been repeated prior to the current Y-direction error-correction procedure B by the step 12/7. All the erred words contained in the subblock in question are therefore detected with the flag bits of all the words in the subblock set to "1"s and can thus be corrected properly by the subsequent correction procedures. In the event there is no false correction of words made in the procedure shown in FIG. 12, the flag bits of all the words properly corrected are set to "1"s and adds to the number of the words which are free from error and which are none the less given bit "1" error flags. These added actually correct bit "1" flag words are decreased in number as the erred words are corrected as the error correction procedures B and D are repeated subsequently and, for this reason, will not significantly affect the final result of correction. In carrying out a method according to the present invention with use of the procedure of FIG. 12, the final (viz., $J^{th}$) Z-direction error-correction procedure D in the flowchart of FIG. 2 should be performed as in the procedure described with reference to FIG. 3 or the flag bit of the individual words of the subblock should be entirely disregarded during the final X-direction error-correction procedure C. This is important because those words which have been found truly uncorrectable are to be finally detected as erred words by the X-direction error-detection procedure E (FIG. 2) upon completion of the whole detection and correction cycles.

If desired, the correction procedure hereinbefore described with reference to FIG. 12 may be modified so that the flag bits of the words in the subblock are treated otherwise when there are two bit "1" error flag words included in the subblock. In this instance, the flag bits of all the words in the subblock may be either reset to "0"s or neither set to "1"s nor reset to "0", depending upon whether or not the location of the error as determined on the basis of the syndromes $S_{PY}$ and $S_{QY}$ corresponds to one of the two words each with the bit "1" error flag. The modified procedure will also provide acceptable final results of correction since such a procedure gives rise to an increase in the number of non-detected errors although a decrease in the number of actually error-free bit "1" error flag words.

When the error correction procedure described as above with reference to FIG. 12 is used, the errors in the error and flag pattern represented by the Y-Z plane $M_2$ shown in FIG. 4 are corrected in a manner described with reference to FIGS. 13A to 13D which correspond to FIGS. 5A to 5D, respectively.

FIGS. 13A to 13D exemplify the manner in which correction is to be made for the error and flag pattern represented by the Y-Z plane $M_2$ in FIG. 4 by the method described with reference to FIG. 12. As discussed with reference to FIGS. 5A to 5D, this Y-Z plane $M_2$ is assumed to have the error and flag pattern including a single erred word bearing a bit "0" error-free flag "o" and two words each bearing a bit "1" error flag "⊗" in the Y-direction subblock $Y_1$.

By the first Y-direction error-correction procedure B subsequent to the first X-direction error-detection procedure A (step 12/14 in FIG. 12), the two words each bearing the bit "1" error flag "⊗" in the Y-direction subblock $Y_1$ are corrected. This correction is however false since the particular words are actually correct although they have been given the bit "1" error flags. When the flag bits of all the words in each of the Y-direction subblocks including the additional two erred words resulting from the false correction are then set to "1"s, the flag bit of the actually erred word with the bit "0" error-free flag "o" and the flag bits of the falsely corrected words each with the bit "1" error flags " " are changed to bit "1" error flags "x", as shown in FIG. 13B. Furthermore, the flags of the words at the blank intersections in the subblock $Y_1$ are changed to bit "1" error flags "⊗". The Y-Z plane $M_2$ is further assumed to include three words each with a bit "1" error flag "⊗" within each of the Y-direction subblocks $Y_2$ and $Y_3$ thereon. As also previously discussed, two of these three words each with the flag "x" are not corrected by the first Y-direction error-correction procedure B so that the bit "1" error flags "⊗" of the words are maintained at the end of the second X-direction error-detection procedure C in each of the Y-direction subblocks $Y_2$ and $Y_3$ as will be seen from FIG. 13B.

By the first Z-direction error-detection procedure D subsequent to the second X-direction error-correction procedure C, the single word with the correct bit "1" error flag "⊗" in the Z-direction subblock $Z_1$ is corrected as shown in FIG. 13C, the flag bits of the words in the subblock $Z_1$ being determined depending upon the result of the subsequent second X-direction error-detection procedure C. In each of the Z-direction subblocks $Z_2$ and $Z_3$, the two words consisting of the single word with the bit "1" error flag "⊗" and the single word with the bit "1" error flag "x" are corrected and the flag bits of all the words are set to "1"s so that all the words have the bit "1" error flag "x" as shown in FIG. 13C. During the Z-direction error-correction procedure D are also corrected the two words each with a bit "1" error flag "x" in the error pattern including a single word with a bit "1" error flag "⊗" and two words each with a bit "1" error flag "x" in each of the Y-direction subblocks $Z_2$ and $Z_3$ on other Y-Z planes. All the erred words in each of the Z-direction subblocks $Z_1$, $Z_2$ and $Z_3$ are thus corrected at the end of the Z-direction error-correction procedure D. By the subsequent third X-direction error-detection procedure C, the flag bits of all the words in the subblock $Z_1$ are reset to "0"s and the flag bits of all the words in each of the subblocks $Z_2$ and $Z_3$ are maintained in "0" states, as will be also seen from FIG. 13C. By the second Y-direction error-correction procedure C subsequent to the third X-direction error-detection procedure C, the flag bits of all the words on the Y-Z plane $M_2$ are reset to "0"s in the absence errors on the particular plane $M_2$ as shown in FIG. 13D.

The error correction procedure as above described may be modified so that the flag bits of all the words in the subblock are to be either reset to "0"s or determined depending upon the subsequent X-direction error-detection procedure after the words with the error pattern including the single word with the bit "1" error flag 37 ⊗ " and the single word with the bit "1" error flag "x" are corrected by the first Z-direction error-correction procedure D. When this modified error correction procedure is used, not only all the words in the subblock are corrected but the flag bits of all the words in the subblock are reset to "0"s so that all the words are corrected properly by the first Z-direction error-correction procedure D.

A fourth preferred example of a method of correcting errors according to the present invention will now be described with reference to FIG. 14 of the drawings. The Y-direction error-correction procedure B in the example of a method according to the present invention as shown in FIG. 14 is also largely similar to the procedure described with reference to FIG. 3. The various process and decision steps having their exact equivalents in the procedure shown in FIG. 3 are thus indicated by the same numerals as in FIG. 3 with a common numerical prefix 14 over a slash mark. The procedure B in the example of a method according to the present invention as shown in FIG. 14 differs from the procedure of FIG. 3 in the steps to follow the error correction step 14/14.

When there are two or more bit "1" error flag words included in the data and error check words in a Y-direction subblock, it is determined by the decision step 14/12 whether or not there are two, and only two, bit "1" error flag words within the subblock in question. If the answer in this step 14/12 is in the affirmative "YES", it is further determined by the subsequent decision step 14/13 whether or not both of the syndromes $S_{PY}$ and $S_{QY}$ for the Y-direction subblock including the two bit "1" error flag words are zero. If both of the syndromes $S_{PY}$ and S are found to be zero for the particular subblock, it is deemed that there actually are no errors occurring in the subblock and, thus, the flag bits for all the data and error check words of the subblock are reset to "0"s by the step 3/3 as in the procedure described with reference to FIG. 3.

If it is found by the decision step 14/13 that at least one of the syndromes $S_{PY}$ and $S_{QY}$ is not zero for the Y-direction subblock in question, it is deemed that the two data words each having the bit "1" error flag are actually in error. The decision step 14/13 is thus followed by the step 14/14 to correct these errors on the basis of the syndromes $S_{PY}$ and $S_{QY}$. In the procedure described with reference to FIG. 3, the flag bits for all the data and error check words of the subblock are neither reset to "0"s nor set to "1"s and are to be set or reset depending upon the results of the subsequent X-direction error-detection procedure C of the flowchart of FIG. 2.

In the error correction procedure shown in FIG. 14, the step 14/14 is followed by a step 14/20 to determine the locations of the erred words also on the basis of the syndromes $S_{PY}$ and $S_{QY}$. Thereupon, it is determined by a decision step 14/21 whether or not the words at the locations where the errors have thus been detected to occur have the bit "1" error flags within the subblock in question. When it is found by this decision step 14/18 that any of these particular words has the bit "1" error flag, it is deemed that the particular word is in error and that the remaining words have been erroneously determined to be free from error by the error-detection procedure A. In this instance, the flag bits for all the data and error check words of the subblock are maintained thereafter by the imaginary step 14/15. If it is found by the decision step 14/21 that none of the words at the locations where the errors have been detected to occur has the bit "1" error flag within subblock in question, the flag bits for only the two words corrected by the preceding step 14/14 are set to "1"s and the flag bits of the other words in the subblock are neither reset to "0"s nor set to "1"s as indicated by a step 14/22. The flag bits of the words thus maintained by the imaginary step 14/15 or the step 14/22 are to be set or reset depending upon the results of the subsequent second X-direction error-detection procedure C.

When the location of any of the words as determined by the step 20 is found to correspond to one of the two words each with the bit "1" error flag as above mentioned, it is likely that the word at the particular location is in error and the other of the two words with the bit "1" error flags is actually correct. This means that it is unlikely that the subblock in question includes an erred word which has failed to be detected to be in error and, for this reason, there is little possibility that false correction might occur in the subblock during the subsequent error detection procedure or procedures. It is for this reason that the flag bits for all the data and error check words of the subblock are neither reset to "0"s nor set to "1"s when the location of any of the words as determined by the step 20 is found to correspond to one of the words each with the bit "1" error flag. Similarly successful results could however be achieved if such a procedure is modified so that the flag bits for all the words are reset to "0"s as by the step 14/3. If, on the other hand, none of the words at the error locations determined by the step 14/20 has the bit "1" error flag within the subblock in question, it is not unlikely that the subblock includes a non-detected erred word so that there is appreciable possibility that false correction might occur in the subblock. On such an assumption, the flag bits for only the two words corrected by the preceding step 14/14 are set to "1"s and the flag bits of the other words in the subblock are neither reset to "0"s nor set to "1"s when none of the words at the error locations determined by the step 14/20 has the bit "1" error flag within the subblock. This means that the error resulting from the false correction has virtually been detected and can thus be corrected properly during the subsequent error correction procedure or procedures. The erred word which has failed to be detected to be in error remains undetected but is likely to be corrected during the subsequent error correction procedure or procedures since the other erred word in the particular subblock has already been detected. When there is no false detection invited, the flag bits for the properly corrected two words are set to "1"s so that the number of the correct words given the bit "1" error flags increase. The number of such words will however decrease as the number of the erred words decrease as the error correction procedures are repeated as shown in the flowchart of FIG. 2 and will not thus seriously affect the final result of correction of the particular subblock.

In carrying out a method according to the present invention with use of the procedure of FIG. 13, the final (viz., $J^{th}$) Z-direction error-correction procedure D in the flowchart of FIG. 2 should also be performed as in the procedure described with reference to FIG. 3 or the flag bit of the individual words of the subblock should be entirely disregarded during the final X-direction error-correction procedure C. This is important because those words which have been found truly uncorrectable are to be finally detected as erred words by the X-direction error-detection procedure E (FIG. 2) upon completion of the whole detection and correction cycles as previously noted in connection with the procedure of FIG. 12.

When the error correction procedure described as above with reference to FIG. 14 is used, the errors in the error and flag pattern represented by the Y-Z plane $M_2$ shown in FIG. 4 are corrected in a manner described with reference to FIGS. 15A to 15D.

FIGS. 15A to 15D, which also correspond to FIGS. 5A to 5D, respectively, exemplify the manner in which correction is to be made for the error and flag pattern represented by the Y-Z plane $M_2$ in FIG. 4 by the method described with reference to FIG. 14. As discussed previously, this Y-Z plane $M_2$ is assumed to have the error and flag pattern including a single erred word bearing a bit "0" error-free flag "o" and two words each bearing a bit "1" error flag "⊗" in the Y-direction subblock $Y_1$.

By the first Y-direction error-correction procedure B subsequent to the first X-direction error-detection procedure A (step 14/14 in FIG. 14), the two words each bearing the bit "1" error flag "⊗" in the Y-direction subblock $Y_1$ are corrected. This correction is however false since the particular words are actually correct although they have been given the bit "1" error flags. The Y-Z plane $M_2$ is further assumed to include three words each with a bit "1" error flag " " within each of the Y-direction subblocks $Y_2$ and $Y_3$ thereon. As also previously discussed, two of these three words each with the flag "x" are not corrected by the first Y-direction error-correction procedure B so that the bit "1" error flags "⊗" of the words are maintained at the end of the second X-direction error-detection procedure C in each of the Y-direction subblocks $Y_2$ and $Y_3$ as will be seen from FIG. 15B. The single actually erred word having the bit "0" error-free flag "o" in the subblock $Y_1$ is not detected to be in error by the subsequent second X-direction error-detection procedure C as will be also seen from FIG. 15B.

By the first Z-direction error-detection procedure D subsequent to the second X-direction error-correction procedure C, the two actually correct words each bearing the incorrect bit "1" error flag "⊗" in the Z-direction subblock $Z_1$ are falsely corrected as in the Y-direction subblock $Y_1$ with the result that there are additional two erred words created. These two additional erred words have their flag bits set to "1"s and thus have flags "⊗" at the end of the second X-direction error-detection procedure C as shown in FIG. 15C. In each of the Z-direction subblocks $Z_2$ and $Z_3$, the two words consisting of the single word with the bit "1" error flag "⊗" and the single word with the bit "1" error flag "x" are corrected. The flag bits of all the words in each of the Z-direction subblocks $Z_2$ and $Z_3$ are determined depending upon the result of the subsequent third X-direction error-detection procedure A. During the Z-direction error-correction procedure D are also corrected the two words each with a bit "1" error flag "x" in the error pattern including a single correct word with a bit "1" error flag "⊗" and two erred words each with a bit "1" error flag "x" in each of the Z-direction subblocks $Z_2$ and $Z_3$ on other Y-Z planes. All the erred words in each of the Z-direction subblocks $Z_1$, $Z_2$ and $Z_3$ are thus corrected and have bit "0" error-free flags by the end of the third X-direction error-detection procedure A. By the subsequent third X-direction error-detection procedure C, the flag bits of all the words in the subblock $Z_1$ are reset to "0"s and the flag bits of all the words in each of the subblocks $Z_2$ and $Z_3$ are maintained in "0" states, as will be also seen from FIG. 15C. If desired, the flag bits of all the words in each of the subblocks $Z_2$ and $Z_3$ may be reset to "0"s upon completion of the first Z-direction error-correction procedure D. By the subsequent second Y-direction error-correction procedure C following the third X-direction error-detection procedure C, the single word with the bit "0" error-free flag "o" is corrected in the Y-direction subblock $Y_1$ and concurrently the single word with the bit "1" error flag "x" is corrected in each of the Y-direction subblock $Y_2$ and $Y_3$ so that all the words in the Y-Z plane $M_2$ become correct as will be seen from FIG. 15D.

While it has been assumed that a method according to the present invention is to be carried out using the error detection and correction procedures represented by the flowchart shown in FIG. 2, such procedures may be modified in numerous manners if desired. Examples of such modified error detection and correction procedures are represented by the flowcharts illustrated in FIGS. 16 and 17 of the drawings.

In the error detection and correction procedures represented by the flowchart of FIG. 16 is eliminated the second X-direction error-detection procedure subsequent to the Y-direction error-correction procedure B. Where the error detection and correction procedures thus dispensing with the second X-direction error-detection procedure C (FIG. 2), the flag bits must be determined upon completion of the preceding error detection procedure. Thus, the step by which the flag bits of all the words in a given subblock are to be neither set nor reset (as in the imaginary step 8/15, 10/15, 12/15 or 14/15) in the Y-direction error-correction procedure B should be substituted by a step by which the flag bits of all the words in the subblock are to be set or reset to the states of the flag bits which have been determined by the initial X-direction error-detection procedure A. The flag bits of all the words in the given subblock are in this fashion determined at the end of the Y-direction error-correction procedure B.

On the other hand, the error detection and correction procedures represented by the flowchart of FIG. 17 dispenses with the X-direction error-detection procedure to precede the Y-direction error-correction procedure B in each of the cycles following the first error detection and correction cycle. In this instance, it is also important that the flag bits be determined at the end of the Z-direction error correction procedure Z in a manner similar to that above described in connection with the procedures represented by the flowchart of FIG. 16. The procedures represented by the flowchart of FIG. 17 will result in an increase in the number of such words that are to be given the bit "1" error flags although the words are in reality free from error. This however would invite no serious problems if the error correction procedures are repeated a number of times.

While, furthermore, it has been described that the initial correction of errors is to be made immediately after the first X-direction error-detection procedure, the first error correction procedure may be performed after detection of errors has been effected in two different directions. For this purpose, errors are detected first in an X-direction subblock and thereafter in a Z-direction subblock before the first error correction procedure is to be performed. In this instance, the flags for the words are determined after the detection of errors in the "Z" direction is complete and, for this reason, it is necessary to use syndromes $S_{PZ}$ and $S_{QZ}$ in lieu of the syndromes $S_{PY}$ and $S_{QY}$ for a Y-direction subblock and to eliminate the step of correcting errors on the basis of the syndromes. To perform correction of errors in this fashion, it is necessary that the flowchart described with reference to each of FIGS. 8, 10, 12 and 14 to be modified in two respects. Firstly, the step by which the flag bits of all the words in a given subblock are to be neither set nor reset in the Y-direction error-correction procedure B must be substituted by a step by which the flag bits of all the words in the subblock are to be set or reset to the states of the flag bits which have been determined by the initial X-direction error-detection procedure. While, furthermore, the flag bits of all the words in a given subblock are to be reset to "0"s after a single word has been corrected on the basis of the syndromes $S_{PY}$ and $S_{QY}$ by the step 8/5, 10/5, 12/5 or 14/5 in each of the flowcharts hereinbefore described, such a step should be substituted by a step by which the flag bits of only the word which has been corrected on the basis of the syndromes $S_{PZ}$ and $S_{QZ}$ is to be set to "1" and the flag bits of all the remaining words are to be reset to "0"s.

It has further been described that the Z-direction error-correction procedure D is to be performed subsequently to the Y-direction error-correction procedure B, the latter may be performed prior to the former if desired. The final X-direction error-detection procedure E in each of the flowcharts shown in FIGS. 2, 16 and 17 is useful for the detection of residual words to be left in erred states when the final Z-direction error-correction procedure D (or the final Y-direction error-correction procedure B if performed subsequently to the final Z-direction error-correction procedure as above noted). Such a final X-direction error-detection procedure E may however be eliminated where detection of the residual errors is not required or of importance.

As described previously, furthermore, the flag bits of all the words are to be set to "1"s when it is found in the step 8/5, 10/5, 12/5 or 14/5 that the word at the location determined by the preceding step 8/4, 10/4, 12/4 or 14/4 on the basis of the syndromes $S_{PY}$ and $S_{QY}$ corresponds to the unique bit "1" error-flag word in the subblock. Alternatively to such a procedure, the word at the location determined on the basis of the syndromes $S_{PY}$ and $S_{QY}$ is corrected if the particular word has been found to correspond to the bit "1" error-flag word in the subblock whereupon the flag bits of all the words are either set to "1"s or neither set to "1"s nor reset to "0"s.

While, furthermore, it has been described in connection with the procedure shown in FIG. 8 that the manner in which the flag bits are to be changed is altered in the third cycle of repeating the procedures A to D in the flowchart of FIG. 2, such a manner may be altered for the Y-direction error correction procedure B when the procedure B has been repeated one number of times and for the Z-direction error correction procedure D when the procedure D has been repeated another number of times. For example, the manner in which the flag bits are to be changed may be altered at the end of the third the Y-direction error correction procedure B and at the end of the second Z-direction error correction procedure D. The changes in the flag bits are made for the correction of errors during the immediately subsequent error correction procedures, the flag bits changed at the end of the second Z-direction error-correction procedure can be utilized for the correction of errors during the next Y-direction error correction procedure D. While the manner in which the flag bits are to be changed is altered depending upon the number which each of the Y-direction and Z-direction error correction procedures B and D has been repeated. Similar results could be achieved also when the manner in which the correction of errors is to be made is altered depending upon the number which each of the Y-direction and Z-direction error correction procedures B and D has been repeated.

It has been assumed that Reed-Solomon codes each consisting of two error check words are used as the error detection and correction codes but a method according to the present invention may be carried out with use of any other forms of presently known error detection and correction codes.

While, furthermore, it has been described that a method according to the present invention is to be carried out with use of the three-dimensional matrix word block shown in FIG. 1, it will be apparent that any other form of word block may be utilized insofar as the word block includes a single set of error detection codes and two sets of error correction codes. Examples of such a different form of word block are shown in FIGS. 18 and 19 of the drawings. The example shown in FIG. 18 is a word block having a theoretically indefinite length (which is actually finite) and having data and error check words arranged in mutually intersecting "X", "Y" and "Z" directions. On the other hand, the example shown in FIG. 19 consists of a segment of the indefinitely long word block shown in FIG. 18 and has its opposite ends linked together.

The word block of the nature shown in FIG. 18 can be produced with use of a coding network shown in FIG. 20. The coding network comprises a Z-direction error correction coder circuitry 30, a Y-direction error correction coder circuitry 31, and an X-direction error detection coder circuitry 32. The Z-direction error correction coder circuitry 30 receives an a number of data words $W_1$ to $W_a$ each of, for example, 8 bits and is operative not only to transparently pass these data words $W_1$ to $W_a$ therethrough but to generate error check words $C_{z1}$ to $C_{zb}$ as Z-direction error correction codes from the supplied data words $W_1$ to $W_a$. The data words $W_1$ to $W_a$ passed through the Z-direction error correction coder circuitry 30 are transferred to the Y-direction error correction coder circuitry 31 through delay circuits $D_{11}$, $D_{12}$, ... $D_{1a}$, respectively, and the error check words $C_{z1}$ to $C_{zb}$ generated by the coder circuitry 30 are transferred to the coder circuitry 31 through delay circuits $D_{1(a+1)}$, ... $D_{1(a+b)}$, respectively, as shown. The individual delay circuits $D_{11}$, $D_{12}$, ... $D_{1a}$ and the delay circuits $D_{1(a+1)}$, ... $D_{1(a+b)}$ have respective delay times which differ from one of the delay circuits to another. The Y-direction error correction coder circuitry 31 is operative not only to transparently pass therethrough the data words $W_1$ to $W_a$ and error check words $C_{z1}$ to $C_{zb}$ respectively supplied from the delay circuits $D_{11}$, $D_{12}$, ... $D_{1a}$ and the delay circuits $D_{1(a+1)}$, ... $D_{1(a+b)}$ but to generate error check words $C_{y1}$ to $C_{yc}$ as Y-direction error correction codes from the supplied words. The data words $W_1$ to $W_a$ passed through the Y-direction error correction coder circuitry 31 are transferred to the X-direction error detection coder circuitry 32 through delay circuits $D_{21}$, $D_{22}$, ... $D_{2a}$, respectively. The Z-direction error check words $C_{z1}$ to $C_{zb}$ passed through the Y-direction error correction coder circuitry 31 are transferred to the X-direction error detection coder circuitry 32 through delay circuits $D_{2(a+1)}$, ... $D_{2(a+b)}$, respectively. Furthermore, the Y-direction error check words $C_{y1}$ to $C_{yc}$ generated by the Y-direction error correction coder circuitry 30 are transferred to the X-direction error detection coder circuitry 32 through delay circuits $D_{2(b+1)}$, ... $D_{2(b+c)}$, respectively, as shown. The individual delay circuits $D_{21}$, $D_{22}$, ... $D_{2a}$, delay circuits $D_{2(a+1)}$, ... $D_{2(a+b)}$ and delay circuits $D_{2(b+1)}$, ... $D_{2(b+c)}$ have respective delay times which differ from one of the delay circuits to another. The X-direction error detection coder circuitry 32 is operative not only to transparently pass therethrough the data $W_1$ to $W_a$ and error check words $C_{z1}$ to $C_{zb}$ and $C_{y1}$ to $C_{yc}$ supplied from the delay circuits $D_{21}$, $D_{22}$, ... $D_{2a}$, delay circuits $D_{2(a+1)}$, ... $D_{2(a+b)}$ and delay circuits $D_{2(b+1)}$, ...

$D_{2(b+c)}$ but to generate error check words $C_{x1}$ to $C_{xd}$ as X-direction error detection codes from the supplied words. Thus, the X-direction error detection coder circuitry 32 delivers the data words $W_1$ to $W_a$, Z-direction error check words $C_{z1}$ to $C_{zb}$, Y-direction error check words $C_{y1}$ to $C_{yc}$ and X-direction error check words $C_{x1}$ to $C_{xd}$ as shown. These data words $W_1$ to $W_a$, Z-direction error check words $C_{z1}$ to $C_{zb}$, Y-direction error check words $C_{y1}$ to $C_{yc}$ and X-direction error check words $C_{x1}$ to $C_{xd}$ are arranged in this sequence in the word block shown in FIG. 18 and are sampled in the sequence of, for example, directions X, Y and Z.

What is claimed is:

1. A method of correcting errors in binary coded words organized in a word block consisting of a plurality of data words and a plurality of error check words and consisting of a plurality of subblocks which can be selectively grouped on the basis of one of three different criteria to form one of three different sets of subblocks which consist of first, second and third sets of subblocks wherein, if at least two of the data words and error check words in said word block are included in one of said first, second and third subblocks, said at least two of the data words and error check words could not be concurrently included within each of the other subblocks, comprising generating a first error correction code on the basis of each of the subblocks in said first set of subblocks, a second error correction code on the basis of each of the subblocks in said second set of subblocks, and an error detection code on the basis of each of the subblocks in said third set of subblocks, adding a binary coded flag to each of said plurality of data words and said plurality of error check words, said flag being indicative of the presence or absence of an error within the word to which the flag is added, detecting errors within each of said third set of subblocks on the basis of each of said error detection codes, correcting errors within each of said first set of subblocks on the basis of said first error correction code with reference to the flags respectively added to the words in each of the subblocks and correcting errors within each of said second set of subblocks on the basis of said second error correction code with reference to the flags respectively added to the words in each of the subblocks, altering the flag of any of the data and error check words in each of said first set of subblocks each time the correction of errors within each of said first set of subblocks is complete and altering the flag of any of the data and error check words in each of said second set of subblocks each time the correction of errors within each of said second set of subblocks is complete thereafter so that, each time the flag is altered, the flag is indicative of the absence of an error if a word being checked for an error is unlikely to contain an error and indicative of the presence of an error if the word being checked for an error is likely to contain an error or is likely to fail to be detected to be in error, altering the flag of any of the data and error check words if the flag has remained unaltered after the correction of errors on the basis of said first error correction code or on the basis of said second error correction code and if additionally the detection of errors on the basis of said error detection code is executed immediately upon correction of errors, and maintaining the flag of any of the data and error check words so that the flag maintained coincides with the flag added to the word being checked for an error before the word was corrected if the flag has remained unaltered after the correction of errors on the basis of said first error correction code or on the basis of said second error correction code and if additionally the detection of errors on the basis of said error detection code is not executed immediately upon correction of errors, characterized in that correction of errors is effected a plurality of times for the data and error check words in a subblock on the basis of at least one of the first error correction code and the second error correction code and in that the manner of altering the flag of any of the data and error check words in each of said first set of subblocks or in each of said second set of subblocks and the manner of correcting errors within each of said third set of subblocks are varied depending upon the numbers of times the correction of errors is repeated.

2. A method as set forth in claim 1, wherein each of said first error correction code and said second error correction code is such that is capable of correcting up to two words in each of said first set of subblocks and up to two words in each of said second set of subblocks, respectively, if the location of the words in error in a subblock being checked for an error is known and correcting a single word in each of said first set of subblocks and a single word in each of said second set of subblocks, respectively, if the location of the words in error in the subblock being checked for an error is unknown, the error in a word indicated to be in error by the flag added thereto in any of said first set of subblocks being corrected on the basis of said first error correction code and the error in a word indicated to be in error by the flag added thereto in any of said second set of subblocks being corrected on the basis of said second error correction code if the subblock including the erred word to be corrected contains therein two words erred with incorrect flags added thereto before the error in said word indicated to be in error was corrected, if also the subblock including the erred word to be corrected contains therein two words erred with incorrect flags added thereto before the error in said word indicated to be in error was corrected, the flags of all the data and error check words in any of the first set of subblocks are altered to be indicative of the absence of errors in the subblock being checked for an error if it is found on the basis of said first error correction code that there is no erred word in the subblock being checked for an error and the flags of all the data and error check words in any of the second set of subblocks being altered to be indicative of the absence of errors in the subblock being checked for an error if it is found on the basis of said second error correction code that there is no erred word in the subblock being checked for an error, if also the subblock including the erred word to be corrected contains therein two words erred with incorrect flags added thereto before the error in said word indicated to be in error was corrected, the flags of all the data and error check words in any of the first set of subblocks being maintained or altered to be identical in the subblock being checked for an error if the flag of the word at the error location determined on the basic of said first error correction code is indicative of the presence of an error in the word and the flags of all the data and error check words in any of he second set of subblocks being maintained or altered to be identical in the subblock being checked for an error if the flag of the word at the error location determined on the basis of said second error correction code is indicative of the presence of an error in the word, if also the subblock including the erred word to be corrected contains therein two words erred with incorrect flags added thereto before the error in said word indicated to be in error was corrected, the flags of the data and error check words in any of said first set of subblocks being handled in one of two predetermined manners depending upon the number of times the correction of errors is repeated, if it is found on the basis of said first error correction code that there is at least one erred word in the subblock being checked for an error and if additionally the error location determined on the basis of said first error correction code in the subblock being checked for an error is not the location where the flag of the word is indicative of the presence of an error, and if also the subblock including the erred word to be corrected contains therein two words erred with incorrect flags added thereto before the error in said word indicated to be in error was corrected, the flags of the data and error check words in any of said second set of subblocks being handled in one of two predetermined manners depending upon the number of times the correction of errors is repeated, if it is found on the basis of said second error correction code that there is at least one erred word in the subblock being checked for an error and if additionally the error location determined on the basis of said second error correction code in the subblock being checked for an error is not the location where the flag of the word is indicative of the presence of an error.

3. A method as set forth in claim 2, wherein said two predetermined manners consist of two of three manners which consist of a first manner in which the flags of all the words in any of the first set of subblocks or any of the second set of subblocks are to be maintained, a second manner in which each of the flags of only the two words corrected in any of the first set of subblocks or any of the second set of subblocks are to be altered to be indicative of the presence of errors, and a third manner in which the flags of all the words in any of the first set of subblocks or any of the second set of subblocks are to be altered to be indicative of the presence of errors.

4. A method as set forth in claim 2, wherein, if the subblock including the erred word to be corrected contains therein less or more than two words erred with incorrect flags added thereto before the errors in the words are corrected, the word at the error location determined on the basis of said first error correction code or said second error correction code is corrected if the subblock including the erred word to be corrected contains therein no word erred with an incorrect flag added thereto before the error in the word at said error location was corrected and if additionally said error location is found to correspond to any one of the words in the subblock being checked for an error, and the word at the error location determined on the basis of said first error correction code or said second error correction code is corrected if the subblock including the erred word to be corrected contains therein a single word erred with an incorrect flag added thereto before the error in the word at said error location was corrected or at least three words erred with incorrect flags added thereto before the error in the word at said error location was corrected and if additionally the flag of the word at said error location is indicative of the presence of an error in the word being checked for an error, the flags of all the words in any of said first set of subblocks or any of said second set of subblocks being altered to be indicative of the absence of errors in the words being checked for errors if the subblock including the erred word to be corrected contains therein up to one word erred with an incorrect flag added thereto before the error in the word was corrected and if additionally either it is found on the basis of said first error correction code or said second error correction code that the subblock being checked for an error contains no erred word or there is a word corrected in the subblock being checked for an error, and the flags of all the words in any of said first set of subblocks or any of said second set of subblocks being altered to be indicative of the presence of errors in the words being checked for errors if the subblock including the erred word to be corrected contains therein up to one word erred with an incorrect flag added thereto before the error in the word was corrected and if additionally it is found on said first error correction code or said second error correction code that there is at least one erred word in the subblock being checked for an error and if additionally there is no word corrected in the subblock being checked for an error.

5. A method as set forth in claim 2, wherein if the subblock including the erred word to be corrected contains therein less or more than two words erred with incorrect flags added thereto before the errors in the words are corrected, the word at the error location determined on the basis of said first error correction code or said second error correction code is corrected if the subblock including the erred word to be corrected contains therein up to one word erred with an incorrect flag added thereto before the error in the word at said error location was corrected and if additionally said error location is found to correspond to any one of the words in the subblock being checked for an error, and the word at the error location determined on the basis of said first error correction code or said second error correction code is corrected if the subblock including the erred word to be corrected contains therein at least three words erred with incorrect flags added thereto before the error in the word at said error location was corrected and if additionally the flag of the word at said error location is indicative of the presence of an error in the word being checked for an error, the flags of all the words in any of said first set of subblocks or any of said second set of subblocks being altered to be indicative of the absence of errors in the words being checked for errors if the subblock including the erred word to be corrected contains therein no word erred with an incorrect flag added thereto before the error in the word was corrected and if additionally either it is found on the basis of said first error correction code or said second error correction code that the subblock being checked for an error contains no erred word or there is a word corrected in the subblock being checked for an error, the flags of all the words in any of said first set of subblocks or any of said second set of subblocks being altered to be indicative of the presence of errors in the words being checked for errors if the subblock including the erred word to be corrected contains therein no word erred with an incorrect flag added thereto before the error in the word was corrected and if, furthermore, it is found on the basis of said first error correction code or on the basis of said second error correction code that there is at least one erred word in the subblock being checked for an error and if additionally there is no word corrected in the subblock being checked for an error, the flags of all the words in any of said first set of subblocks or any of said second set of subblocks being altered to be indicative of the absence of errors in the words being checked for errors if the subblock including the erred word to be corrected contains therein one word erred with an incorrect flag added thereto before the error in the word was corrected and if additionally either it is found on the basic of said first error correction code or said second error correction code that there is no erred word in the subblock being checked for an error or the flag of the word at the error location determined on the basis of said first error correction code or said second error correction code is indicative of the presence of an error in the word, and the flags of all the words in any of said first set of subblocks or any of said second set of subblocks being altered to be indicative of the presence of errors in the words being checked for errors if the subblock including the erred word to be corrected contains therein one word erred with an incorrect flag added thereto before the error in the word was corrected and if the error location determined on the basis of said first error correction code or said second error correction code is not the location where the flag of the word is indicative of the presence of an error in the word.

6. A method as set forth in claim 2, wherein, if the subblock including the erred word to be corrected contains therein less or more than two words erred with incorrect flags added thereto before the errors in the words are corrected, the word at the error location determined on the basis of said first error correction code or said second error correction code is corrected if the subblock including the erred word to be corrected contains therein up to one word erred with an incorrect flag added thereto before the error in the word at said error location was corrected and if additionally said error location is found to correspond to any one of the words in the subblock being checked for an error, and the word at the error location determined on the basis of said first error correction code or said second error correction code is corrected if the subblock including the erred word to be corrected contains therein at least three words erred with incorrect flags added thereto before the error in the word at said error location was corrected and if additionally the flag of the word at said error location is indicative of the presence of an error in the word being checked for an error, the flags of all the words in any of said first set of subblocks or any of said second set of subblocks being altered to be indicative of the absence of errors in the words being checked for errors if the subblock including the erred word to be corrected contains therein no word erred with an incorrect flag added thereto before the error in the word was corrected and if additionally either it is found on the basis of said first error correction code or said second error corrrection code that the subblock being checked for an error contains no erred word or there is a work corrected in the subblock being checked for an error, the flags of all the words in any of said first set of subblocks or any of said second set of subblocks being altered to be indicative of the presence of errors in the words being checked for errors if the subblock including the erred word to be corrected contains therein no word erred with an incorrect flag added thereto before the error in the word was corrected and if, furthermore, it is found on said first error correction code or said second error correction code that there is at least one erred word in the subblock being checked for an error and if additionally there is no word corrected in the subblock being checked for an error, the flags of all the words in any of said first set of subblocks or any of said second set of subblocks being altered to be indicative of the absence of errors in the words being checked for errors if the subblock including the erred word to be corrected contains therein one word erred with an incorrect flag added thereto before the error in the word was corrected and if additionally either it is found on the basis of said first error correction code or said second error correction code that there is no erred word in the subblock being checked for an error or the flag of the word at the error location determined on the basis of said first error correction code or said second error correction code is indicative of the presence of an error in the word, and the flags of all the words in any of said first set of subblocks or any of said second set of subblocks being altered to be indicative of the presence of errors in the words being checked for errors if the subblock including the erred word to be corrected contains therein one word erred with an incorrect flag added thereto before the error in the word was corrected and if additionally the word at the error location determined on the basis of said first error correction code or said second error correction code is found to correspond to none of the words in the subblock being checked for an error.

7. A method of correcting errors in binary coded words organized in a word block consisting of a plurality of data words and a plurality of error check words and consisting of a plurality of subblocks which can be selectively grouped on the basis of one of three different criteria to form one of three different sets of subblocks which consist of first, second and third sets of subblocks wherein, if at least two of the data words and error check words in said word block are included in one of said first, second and third subblocks, said at least two of the data words and error check words could not be concurrently included within each of the other subblocks, comprising generating a first error correction code on the basis of each of the subblocks in said first set of subblocks, a second error correction code on the basis of each of the subblocks in said second set of subblocks, and an error detection code on the basis of each of the subblocks in said third set of subblocks, adding a binary coded flag to each of said plurality of data words and said plurality of error check words, said flag being indicative of the presence or absence of an error within the word to which the flag is added, detecting errors within each of said third set of subblocks on the basis of said error detection codes, correcting errors within each of said first set of subblocks on the basis of said first error correction code with reference to the flags respectively added to the words in each of the subblocks and correcting errors within each of said second set of subblocks on the basis of said second error correction code with reference to the flags respectively added to the words in each of the subblocks, altering the flag of any of the data and error check words in each of said first set of subblocks each time the correction of errors within each of said first set of subblocks is complete and altering the flag of any of the data and error check words in each of said second set of subblocks each time the correction of errors within each of said second set of subblocks is complete thereafter so that, each time the flag is altered, the flag is indicative of the absence of an error if a word being checked for an error is unlikely to contain an error and indicative of the presence of an error if the word being checked for an error is likely to contain an error or is likely to fail to be detected to be in error, altering the flag of any of the data and error check words if the flag has remained unaltered after correction of errors on the basis of said first error correction code or on the basis of said second error correction code and if additionally the detection of errors on the basis of said error detection code is executed immediately upon correction of errors, and maintaining the flag of any of the data and error check words so that the flag maintained coincides with the flag added to the word being checked for an error before the word was corrected if the flag has remained unaltered after the correction of errors on the basis of said first error correction code or on the basis of said second error correction code and if additionally the detection of errors on the basis of said error detection code is not executed immediately upon correction of errors, wherein each of said first error correction code and said second error correction code is such that is capable of correcting up to two words in each of said first set of subblocks and up to two words in each of said second set of subblocks, respectively, if the location of the words in error in a subblock being checked for an error is known and correcting a single word in each of said first set of subblocks and a single word in each of said second set of subblocks, respectively, if the location of the words in error in the subblock being checked for an error is unknown, the word at the error location determined on the basis of said first error correction code or said second error correction code being corrected if the subblock including the erred word to be corrected contains therein one word erred with an incorrect flag added thereto before the error in the word at said error location was corrected and if additionally said error location is found to correspond to any one of the words in the subblock being checked for an error, the flags of all the words in any of said first set of subblocks or any of said second set of subblocks being altered to be indicative of the absence of errors in the words being checked for errors if the subblock including the erred word to be corrected contains therein one word erred with an incorrect flag added thereto before the error in the word was corrected and if additionally either it is found on the basis of said first error correction code or said second error correction code that there is no erred word in the subblock being checked for an error or the flag of the word at the error location determined on the basis of said first error correction code or said second error correction code is indicative of the presence of an error in the word, and the flags of all the words in any of said first set of subblocks or any of said second set of subblocks being altered to be indicative of the presence of errors in the words being checked for errors if the subblock including the erred word to be corrected contains therein one word erred with an incorrect flag added thereto before the error in the word was corrected and if additionally the word at the error location determined on the basis of said first error correction code or said second error correction code is found to correspond to none of the words in the subblock being checked for an error.

8. A method of correcting errors in binary coded words organized in a word block consisting of a plurality of data words and a plurality of error check words and consisting of a plurality of subblocks which can be selectively grouped on the basis of one of three different criteria to form one of three different sets of subblocks which consist of first, second and third sets of subblocks wherein, if at least two of the data words and error check words in said word block are included in one of said first, second and third subblocks, said at least two of the data words and error check words could not be concurrently included within each of the other subblocks, comprising generating a first error correction code on the basis of each of the subblock in said first set of subblocks, a seoond error correction code on the basis of each of the subblocks in said second set of subblocks, and an error detection code on the basis of each of the subblocks in said third set of subblocks, adding a binary coded flag to each of said plurality of data words and said plurality of error check words, said flag being being indicative of the presence or absence of an error within the word to which the flag is added, detecting errors within each of said third set of subblocks on the basis of each of said error detection codes, correcting errors within each of said first set of subblocks on the basis of said first error correction code with reference to the flags respectively added to the words in each of the subblocks and correcting errors within each of said second set of subblocks on the basis of said second error correction code with reference to the flags respectively added to the words in each of the subblocks, altering the flag of any of the data and error check words in each of said first set of subblocks each time the correction of errors within each of said first set of subblocks is complete and altering the flag of any of the data and error check words in each of said second set of subblocks each time the correction of errors within each of said second set of subblocks is complete thereafter so that, each time the flag is altered, the flag is indicative of the absence of an error if a word being checked for an error is unlikely to contain an error and indicative of the presence of an error if the word being checked for an error is likely to contain an error or is likely to fail to be detected to be in error, altering the flag of any of the data and error check words depending upon the result of the detection if the flag has remained unaltered after the correction of errors on the basis of said first error correction code or on the basis of said second error correction code and if additionally the detection of errors on the basis of said error detection code is executed immediately upon correction of errors, and maintaining the flag of any of the data and error check words so that the flag altered or maintained coincides with the flag added to the word being checked for an error before the word was corrected if the flag has remained unaltered after the correction of errors on the basis of said first error correction code or on the basis of said second error correction code and if additionally the detection of errors on the basis of said error detection code is not executed immediately upon correction of errors, wherein each of said first error correction code and said second error correction code is such that is capable of correcting up to two words in each of said first set of subblocks and up to two words in each of said second set of subblocks, respectively, if the location of the words in error in a subblock being checked for an error is known and correcting a single word in each of said first set of subblocks and a single word in each of said second set of subblocks, respectively, if the location of the words in error in a subblock being checked for an error is unknown, the error in a word indicated to be in error by the flag added thereto in any of said first set of subblocks being corrected on the basis of said first error correction code and the error in a word indicated to be in error by the flag added thereto in any of said second set of subblocks being corrected on the basis of said second error correction code if the subblock including the erred word to be corrected contains therein two words erred with incorrect flags added thereto before the error in said word indicated to be in error was corrected, if also the subblock including the erred word to be corrected contains therein two words erred with incorrect flags added thereto before the error in said word indicated to be in error was corrected, the flags of all the data and error check words in any of the first set of subblocks being altered to be indicative of the absence of errors in the subblock being checked for an error if it is found on the basis of said first error correction code that there is no erred word in the subblock being checked for an error and the flags of all the data and error check words in any of the second set of subblocks being altered to be indicative of the absence of errors in the subblock being checked for an error if it is found on the basis of said second error correction code that there is no erred word in the subblock being checked for an error, if also the subblock including the erred word to be corrected contains therein two words erred with incorrect flags added thereto before the error in said word indicated to be in error was corrected, the flags of all the data and error check words in any of the first set of subblocks being maintained or altered to be identical in the subblock being checked for an error if the flag of the word at the error location determined on the basis of said first error correction code is indicative of the presence of an error in the word and the flags of all the data and error check words in any of the second set of subblocks being maintained or altered to be identical in the subblock being checked for an error if the flag of the word at the error location determined on the basis of said second error correction code is indicative of the presence of an error in the word, and if also the subblock including the erred word to be corrected contains therein two words erred with incorrect flags added thereto before the error in said word indicated to be in error was corrected, the flags of all the data and error check words in any of said first set of subblocks or any of said second set of subblocks being altered to be indicative of the presence of errors in the subblock being checked for an error if the error location determined on the basis of said first error correction code or said second error correction code is not the location where the flag of the word is indicative of the presence of an error.

9. A method of correcting errors in binary coded words orgainzed in a word block consisting of a plurality of data words and a plurality of error check words and consisting of a plurality of subblocks which can be selectively grouped on the basis of one of three different criteria to form one of three different sets of subblocks which consist of first, second and third sets of subblocks wherein, if at least two of the data words and error check words in said word block are included in one of said first, second and third subblocks, said at least two of the data words and error check words could not be concurrently included within each of the other subblocks, comprising generating a first error correction code on the basis of each of the subblocks in said first set of subblocks, a second error correction code on the basis of each of the subblocks in said second set of subblocks, and an error detection code on the basis of each of the subblocks in said third set of subblocks, adding a binary coded flag to each of said plurality of data words and said plurality of error check words, said flag being indicative of the presence or absence of an error within the word to which the flag is added, detecting errors within each of said third set of subblocks on the basis of each of said error detection codes, correcting errors within each of said first set of subblocks on the basis of said first error correction code with reference to the flags respectively added to the words in each of the subblocks and correcting errors within each of said second set of subblocks on the basis of said second error correction code with reference to the flags respectively added to the words in each of the subblocks, altering the flag of any of the data and error check words in each of said first set of subblocks each time the correction of errors within each of said first set of subblocks is complete and altering the flag of any of the data and error check words in each of said second set of subblocks each time the correction of errors within each of said second set of subblocks is complete thereafter so that, each time the flag is altered, the flag is indicative of the absence of an error if a word being checked for an error is unlikely to contain an error and indicative of the presence of an error if the word being checked for an error is likely to contain an error or is likely to fail to be detected to be in error, altering the flag of any of the data and error check words depending upon the result of the detection if the flag has remained unaltered after the correction of errors on the basis of said first error correction code or on the basis of said second error correction code and if additionally the detection of errors on the basis of said error detection code is executed immediately upon correction of errors, and maintaining the flag of any of the data and error check words so that the flag altered or maintained coincides with the flag added to the word being checked for an error before the word was corrected if the flag has remained unaltered after the correction of errors on the basis of said first error correction code or on the basis of said second error correction code and if additionally the detection of errors on the basis of said error detection code is not executed immediately upon correction of errors, wherein each of said first error correction code and said second error correction code is such that is capable of correcting up to two words in each of said first set of subblocks and up to two words in each of said second set of subblocks, respectively, if the location of the words in error in a subblock being checked for an error is known and correcting a single word in each of said first set of subblocks and a single word in each of said second set of subblocks, respectively, if the location of the words in error in the subblock being checked for an error is unknown, the error in a word indicated to be in error by the flag added thereto in any of said first set of subblocks being corrected on the basis of said first error correction code and the error in a word indicated to be in error by the flag added thereto in any of said second set of subblocks being corrected on the basis of said second error correction code if the subblock including the erred word to be corrected contains therein two words erred with incorrect flags added thereto before the error in said word indicated to be in error was corrected, if also the subblock including the erred word to be corrected contains therein two words erred with incorrect flags added thereto before the error in said word indicated to be in error was corrected, the flags of all the data and error check words in any of the first set of subblocks being altered to be indicative of the absence of errors in the subblock being checked for an error if it is found on the basis of said first error correction code that there is no erred word in the subblock being checked for an error and the flags of all the data and error check words in any of the second set of subblocks being altered to be indicative of the absence of errors in the subblock being checked for an error if it is found on the basis of said second error correction code that there is no erred word in the subblock being checked for an error, if also the subblock including the erred word to be corrected contains therein two words erred with incorrect flags added thereto before the error in said word indicated to be in error was corrected, the flags of all the data and error check words in any of said first set of subblocks or any of said second set of subblocks being maintained or altered to be indicative of the absence of errors in the subblock being checked for an error if the flag of the word at the error location determined on the basis of said first error correction code is indicative of the presence of an error in the word and the flags of all the data and error check words in any of the second set of subblocks being maintained or altered to be identical in the subblock being checked for an error if the flag of the word at the error location determined on the basis of said second error correction code is indicative of the presence of an error in the word, and if also the subblock including the erred word to be corrected contains therein two words erred with incorrect flags added thereto before the error in said word indicated to be in error was corrected, the flags of only the two words corrected in any of said first set of subblocks being altered to be indicative of the presence of errors in the subblock being checked for an error if the error location determined on the basis of said first error correction code or said second error correction code is not the location where the flag of the word is indicative of the presence of an error.

* * * * *